United States Patent
Toyoda

(10) Patent No.: US 11,923,451 B2
(45) Date of Patent: Mar. 5, 2024

(54) SEMICONDUCTOR DEVICE

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 331 days.

(21) Appl. No.: 17/332,199

(22) Filed: May 27, 2021

(65) Prior Publication Data

US 2022/0020877 A1 Jan. 20, 2022

(30) Foreign Application Priority Data

Jul. 16, 2020 (JP) ................................ 2020-122384

(51) Int. Cl.
  *G01R 19/00* (2006.01)
  *H01L 29/06* (2006.01)
  *H01L 29/10* (2006.01)
  *H01L 29/78* (2006.01)

(52) U.S. Cl.
  CPC ...... *H01L 29/7815* (2013.01); *G01R 19/0092* (2013.01); *H01L 29/063* (2013.01); *H01L 29/1095* (2013.01); *H01L 29/7813* (2013.01)

(58) Field of Classification Search
  CPC .............. H01L 29/7815; H01L 29/063; H01L 29/1095; H01L 29/7813; G01R 19/0092; G01R 31/2621
  See application file for complete search history.

(56) References Cited

U.S. PATENT DOCUMENTS

| | | | |
|---|---|---|---|
| 10,340,378 B1* | 7/2019 | Arai | H01L 29/7811 |
| 2008/0035992 A1* | 2/2008 | Kawaguchi | H01L 29/66734 |
| | | | 257/E29.066 |
| 2009/0189219 A1 | 7/2009 | Shinbori et al. | |
| 2012/0129307 A1 | 5/2012 | Shinbori et al. | |
| 2013/0154000 A1 | 6/2013 | Shinbori et al. | |
| 2015/0333127 A1 | 11/2015 | Morino et al. | |
| 2018/0358454 A1* | 12/2018 | Okumura | H01L 29/0623 |
| 2018/0366577 A1* | 12/2018 | Toyoda | H01L 29/0692 |
| 2019/0051648 A1* | 2/2019 | Kakimoto | H01L 27/0629 |
| 2020/0091326 A1* | 3/2020 | Iwakaji | H01L 29/7397 |
| 2022/0165879 A1* | 5/2022 | Dainese | H01L 29/7815 |

FOREIGN PATENT DOCUMENTS

| | | | |
|---|---|---|---|
| JP | 5481030 B2 | 4/2014 | |
| JP | 5772842 B2 | 7/2015 | |

* cited by examiner

*Primary Examiner* — Dominic E Hawkins

(57) ABSTRACT

A semiconductor device includes an output-stage element and a detection element, each of the output-stage element and the detection element including: a channel-formation region deposited at an upper part of a drift region; a main electrode region deposited at an upper part of the channel-formation region; and a gate electrode buried via a gate insulating film in one or more first trenches in contact with the main electrode region, the channel-formation region, and the drift region, wherein the first trenches used in common with the detection element and the output-stage element extend in a planar pattern, and a plurality of second trenches extending in parallel to each other in a direction perpendicular to the first trenches interpose the detection element so as to separate the channel-formation region of the output-stage element and the channel-formation region of the detection element from each other.

19 Claims, 25 Drawing Sheets

SEMICONDUCTOR DEVICE

CROSS-REFERENCE TO RELATED APPLICATION

This application claims benefit of priority under 35 USC 119 based on Japanese Patent Application No. 2020-122384 filed on Jul. 16, 2020, the entire contents of which are incorporated by reference herein.

BACKGROUND

1. Field of the Invention

The present invention relates to semiconductor devices, and more particularly, to a power semiconductor integrated circuit (a power IC).

2. Description of the Related Art

Some of power semiconductor elements such as a metal-oxide-semiconductor field-effect transistor (MOSFET) and an insulated gate bipolar transistor (IGBT) include a sense element that detects a main current of a main element and has substantially the same configuration as the main element. To achieve a high reliability, a reduction in size, and a reduction in cost, a power IC is disclosed that includes a vertical MOS transistor as a power semiconductor element at an output stage (referred to below as an "output-stage element") and a control circuit for controlling the output-stage element are monolithically integrated (packaged together) on the same semiconductor chip. An example of such a power IC is a vehicle power IC called an intelligent power switch (IPS).

The power IC on which the output-stage element is mounted further includes a vertical transistor as a sense element (referred to below as a "detection element"), integrated together with the output-stage element, for detecting a main current flowing through the output-stage element as a main element. The control circuit processes detection results obtained by the detection element so as to implement various kinds of functions such as protection and state detection of the power IC (refer to Japanese Patent No. 5481030 and Japanese Patent No. 5772842).

The detection element has a structure similar to the output-stage element, but differs in active area (cell area). A current proportional to the main current flowing through the output-stage element is caused to flow through the detection element, so as to calculate the main current flowing through the output-stage element in accordance with the information on a potential or current acquired from the detection element and a coefficient of proportionality (a sense ratio). The same potential is usually applied to the gates of the output-stage element and the detection element so as to control the sense ratio to be substantially equivalent to an active area ratio.

Typically, the detection element is arranged separately from the output-stage element. The gate of the detection element and the gate of the output-stage element in this case are connected to each other by metal wiring. To further enhance the area efficiency of the chip, the detection element is preferably buried in the output-stage element for making good use of the similar structure between the detection element and the output-stage element so as to use the components in common as much as possible. For example, the detection element and the output-stage element are configured to have the common gate, so as to achieve a decrease in metal wiring area.

When the detection element is buried in the output-stage element as described above, a structure for separating the respective channel-formation regions of the detection element and the output-stage element from each other and a terminal structure for ensuring a breakdown voltage need to be provided between the detection element and the output-stage element. This reduces the effect of decreasing the chip area.

SUMMARY

In view of the foregoing problems, the present invention provides a semiconductor device having a configuration capable of decreasing a chip area when an output-stage element and a detection element for detection a main current flowing through the output-stage element are integrated on the same semiconductor chip.

An aspect of the present invention inheres in a semiconductor device including an output-stage element and a detection element that detects a current of the output-stage element, each of the output-stage element and the detection element including: a drift region of a first conductivity-type; a channel-formation region of a second conductivity-type deposited at an upper part of the drift region; a main electrode region of the first conductivity-type deposited at an upper part of the channel-formation region; and a gate electrode buried via a gate insulating film in one or more first trenches in contact with the main electrode region, the channel-formation region, and the drift region, wherein the first trenches used in common with the detection element and the output-stage element extend in parallel to each other in a planar pattern, and a plurality of second trenches extending in parallel to each other in a direction perpendicular to the first trenches interpose the detection element in the planar pattern so as to separate the channel-formation region of the output-stage element and the channel-formation region of the detection element from each other.

Another aspect of the present invention inheres in a semiconductor device including an output-stage element and a detection element that detects a current of the output-stage element, each of the output-stage element and the detection element including: a drift region of a first conductivity-type; a channel-formation region of a second conductivity-type deposited at an upper part of the drift region; a main electrode region of the first conductivity-type deposited at an upper part of the channel-formation region; and a gate electrode buried via a gate insulating film in one or more first trenches in contact with the main electrode region, the channel-formation region, and the drift region, wherein the first trenches used in common with the detection element and the output-stage element extend in parallel to each other in a planar pattern, at least one second trench extending in a direction perpendicular to the first trenches separates the channel-formation region of the output-stage element and the channel-formation region of the detection element from each other in the planar pattern, and the output-stage element is located only on one side of the detection element in a longitudinal direction of the first trenches.

Further another aspect of the present invention inheres in a semiconductor device including an output-stage element and a detection element that detects a current of the output-stage element, each of the output-stage element and the detection element including: a drift region of a first conductivity-type; a channel-formation region of a second conductivity-type deposited at an upper part of the drift region; a main electrode region of the first conductivity-type deposited at an upper part of the channel-formation region; and a gate electrode buried via a gate insulating film in one or more first trenches in contact with the main electrode region, the channel-formation region, and the drift region, wherein the first trenches used in common with the detection element and the output-stage element extend in parallel to each other in a planar pattern, at least one second trench extending in a direction perpendicular to the first trenches separates the channel-formation region of the output-stage element and the channel-formation region of the detection element from each other in the planar pattern, the channel-formation region of the detection element is arranged such that an end part on a side opposite to a side separated from the channel-formation region of the output-stage element by the second trench is in contact with a first electric field relaxation region of the second conductivity-type having a depth greater than the first trenches, and the channel-formation region of the output-stage element is in contact with a second electric field relaxation region of the second conductivity-type in a longitudinal direction of the first trenches, the second electric field relaxation region being separated from the first electric field relaxation region and having a depth greater than the first trenches.

DETAILED DESCRIPTION

Figure 1:
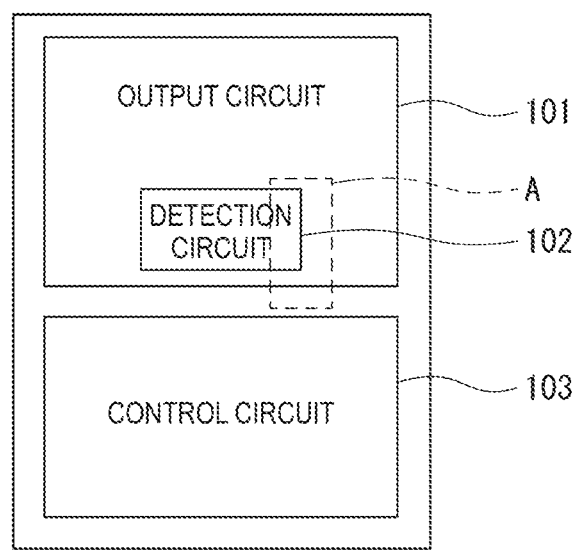
FIG. 1 is a plan view showing an example of a semiconductor device according to a first embodiment.

With reference to the Drawings, first and second embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment, a "first main electrode region" and a "second main electrode region" are a main electrode region of a semiconductor element, in which a main current flows in or out. The first main electrode region is assigned to a semiconductor region which is an emitter region or a collector region in an insulated-gate bipolar transistor (IGBT). The first main electrode region is assigned to a semiconductor region which is a source region or a drain region in a field-effect transistor (FET) or a static induction transistor (SIT). The first main electrode region is assigned to a semiconductor region which is an anode region or a cathode region in a static induction (SI) thyristor or a gate turn-off (GTO) thyristor. The second main electrode region is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor.

That is, when the first main electrode region is the source region, the second main electrode region means the drain region. When the first main electrode region is the emitter region, the second main electrode region means the collector region. When the first main electrode region is the anode region, the second main electrode region means the cathode region.

Further, definitions of directions such as an up-and-down direction such as "top surface" or "bottom surface" or right-and-left direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

First Embodiment

A semiconductor device according to a first embodiment is an integrated circuit including an output circuit (an output-stage element) 101, a detection circuit (a detection element) 102, and a control circuit 103 monolithically integrated on the same semiconductor chip, as illustrated in FIG. 1. The semiconductor device according to the first embodiment has a configuration in which the detection element 102 is buried in the output-stage element 101, which is called a "buried-type" semiconductor device. While FIG. 1 illustrates the detection element 102 arranged inside the output-stage element 101 toward the control circuit 103, the position of the detection element 102 in the output-stage element 101 is not limited to this illustration.

The output-stage element 101 is a semiconductor element such as a trench-gate vertical MOS transistor at an output stage. The detection element 102 is a semiconductor element such as a trench-gate vertical MOS transistor having a structure similar to that of the output-stage element 101, for example. The detection element 102 detects a main current flowing through the output-stage element 101. In particular, the detection element 102 has an active area set to a predetermined ratio (for example, about $1/5000$ to $1/1000$) with respect to an active area of the output-stage element 101, so as to detect the main current flowing through the output-stage element 101 in accordance with a value of current flowing through the detection element 102 and the active area ratio. The control circuit 103 controls the output-stage element 101 in accordance with the detection result of the detection element 102. The control circuit 103 is configured such that semiconductor elements such as horizontal MOS transistors are integrated.

Figure 2:
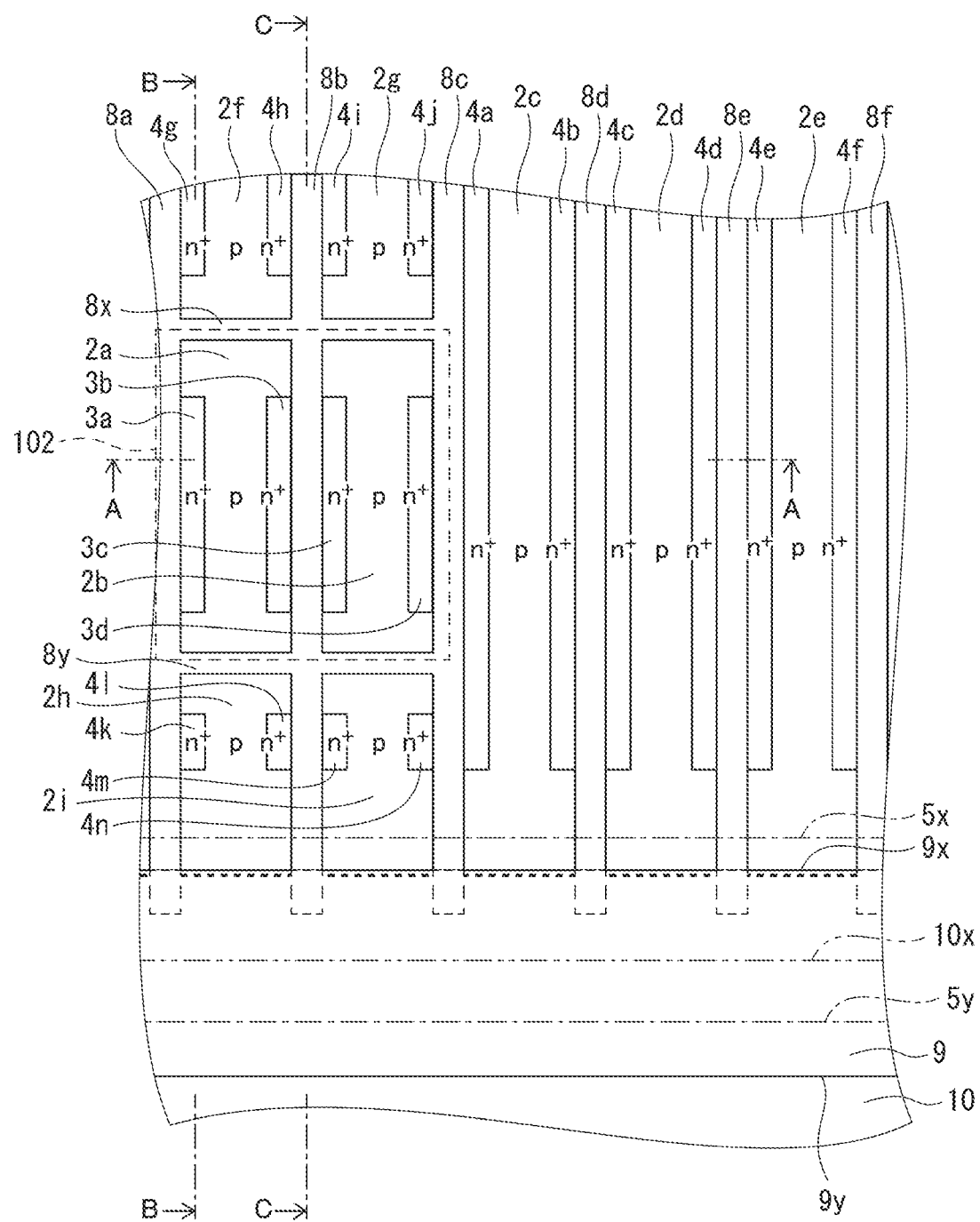
FIG. 2 is a plan view of region A in FIG. 1.

FIG. 2 is a plan view of region A surrounded by the broken line in FIG. 1 adjacent to a right end part of the detection element 102. A region adjacent to the boundary between a left end part of the detection element 102 and the output-stage element 101 illustrated in FIG. 1 has a symmetrical planar layout similar to FIG. 2.

As illustrated in FIG. 2, gate electrodes 8a to 8f are buried in straight trenches and extend in parallel to each other in a planar pattern in the upper-lower direction in FIG. 2. The gate electrodes 8a to 8c on the left side of the gate electrodes 8a to 8f are used in common with the detection element 102 and the output-stage element 101. In addition, gate electrodes 8x and 8y are buried in straight trenches and extend in parallel to each other in a direction perpendicular to the extending direction of the gate electrodes 8a to 8f (in the right-left direction in FIG. 2). The gate electrodes 8x and 8y are arranged to interpose the detection element 102. The respective gate electrodes 8a to 8f, 8x, and 8y are buried in the trenches via a gate insulating film (not illustrated).

The gate electrodes 8x and 8y extend to reach the left end part of the detection element 102 illustrated in FIG. 1. The entire circumference of the detection element 102 is surrounded by the gate electrodes 8x and 8y extending in the right-left direction in FIG. 2, the gate electrode 8c extending in the upper-lower direction in FIG. 2, and another gate electrode extending in the upper-lower direction in FIG. 2 at the left end part of the detection element 102 so as to be separated from the output-stage element 101. While FIG. 2 illustrates the two gate electrodes 8x and 8y, a plurality of gate electrodes may be provided to extend in parallel to each other at the respective positions of the gate electrodes 8x and 8y.

The detection element 102 is defined as a region surrounded by the gate electrode 8c extending in the upper-lower direction in FIG. 2 and the gate electrodes 8x and 8y extending in the right-left direction in FIG. 2. The detection element 102 includes channel-formation regions 2a and 2b of a second conductivity-type (p-type), first main electrode regions (source regions) 3a to 3d of a first conductivity-type ($n^+$-type) deposited at the respective upper parts of the channel-formation regions 2a and 2b, and the gate electrodes 8a, 8b, and 8c arranged in contact with the first main electrode regions 3a to 3d via the gate insulating film (not illustrated).

The output-stage element 101 illustrated in FIG. 1 is defined as a region surrounding the circumference of the detection element 102. As illustrated in FIG. 2, the output-stage element 101 includes channel-formation regions 2c to 2i of the second conductivity-type (p-type), first main electrode regions 4a to 4n of the first conductivity-type ($n^+$-type) deposited at the respective upper parts of the channel-formation regions 2c to 2i, and the gate electrodes 8a to 8f arranged in contact with the first main electrode regions 4a to 4n. The gate electrodes 8a to 8c are used in common with the detection element 102 and the output-stage element 101.

The channel-formation regions 2a and 2b of the detection element 102 on the upper side in the planar pattern in FIG. 2 are separated from the channel-formation regions 2f and 2g of the output-stage element 101 by the gate electrode 8x extending in the right-left direction in FIG. 2. The channel-formation region 2b at the right end part of the detection element 102 is separated from the channel-formation region 2c of the output-stage element 101 by the gate electrode 8c extending in the upper-lower direction in FIG. 2. The channel-formation regions 2a and 2b of the detection element 102 on the lower side in FIG. 2 are separated from the channel-formation regions 2h and 2i of the output-stage element 101 by the gate electrode 8y extending in the right-left direction in FIG. 2.

Figure 3:
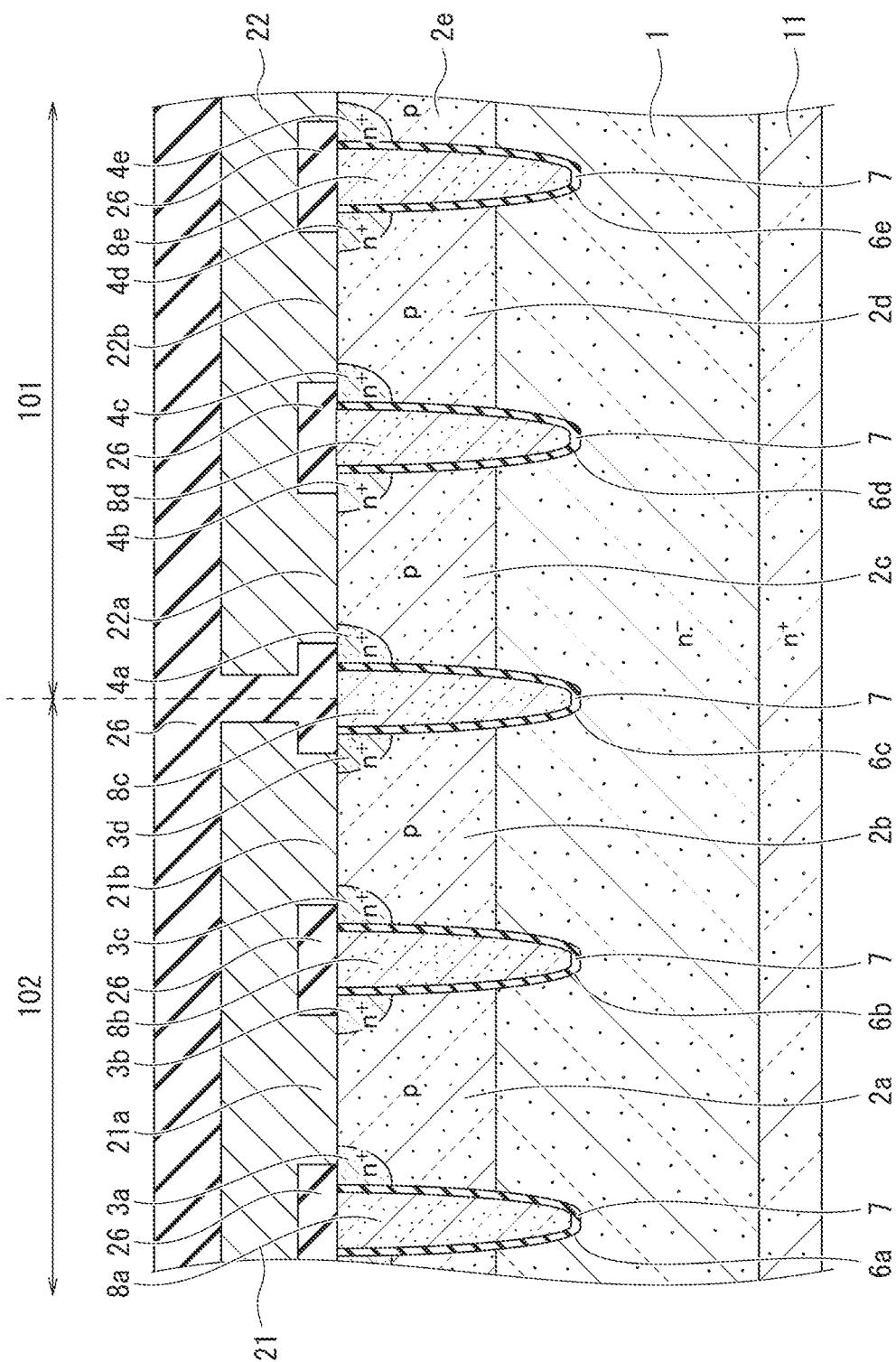
FIG. 3 is a cross-sectional view as viewed from direction A-A in FIG. 2.

FIG. 3 is a cross-sectional view as viewed from direction A-A in the right-left direction in FIG. 2. As illustrated in FIG. 3, the semiconductor device according to the first embodiment includes a semiconductor base body (1, 11) implementing the semiconductor chip. The semiconductor base body (1, 11) includes a low specific-resistance layer 11 of a semiconductor substrate (a Si wafer) of $n^+$-type, and a high specific-resistance layer 1 of $n^-$-type epitaxially grown on the low specific-resistance layer 11 and having a lower impurity concentration than the low specific-resistance layer 11. The semiconductor base body (1, 11) is illustrated below with a case of including a semiconductor material made of silicon (Si) as a parent material, but the parent material is not limited to Si. The semiconductor base body (1, 11) may also be configured such that the low specific-resistance layer 11 of an impurity-doped layer of $n^+$-type is deposited on the bottom surface of the $n^-$-type semiconductor substrate (the Si wafer) serving as the high specific-resistance layer 1 by ion implantation or thermal diffusion.

The output-stage element 101 illustrated on the right side in FIG. 3 partly includes the n⁻-type high specific-resistance layer 1 as a drift region. The output-stage element 101 also partly includes the n⁺-type low specific-resistance layer 11 deposited on the bottom surface of the drift region as a second main electrode region (a drain region). The p-type channel-formation regions 2c to 2e are deposited on the drift region. The n⁺-type first main electrode regions (the source regions) 4a to 4e are provided at the upper parts of the channel-formation regions 2c to 2e. The first main electrode regions 4a to 4e are connected to a main electrode (a source electrode) 22 via contacts 22a and 22b.

The output-stage element 101 illustrated on the right side in FIG. 3 is provided with trenches 6c to 6e penetrating the channel-formation regions 2c to 2e and having a depth to reach the high specific-resistance layer 1. The trenches 6c to 6e are in contact with the n⁺-type first main electrode regions (the source regions) 4a to 4e, the channel-formation regions 2c, 2d, and 2e, and the high specific-resistance layer 1, and is in contact with a p-n junction between the n⁺-type first main electrode regions (the source regions) 4a to 4e and the channel-formation regions 2c, 2d, and 2e and a p-n junction between the channel-formation regions 2c, 2d, and 2e and the high specific-resistance layer 1. The trench 6c separates the detection element 102 and the output-stage element 101 from each other, and is used in common with the detection element 102 and the output-stage element 101.

The inner surface of the respective trenches 6a to 6e is covered with a gate insulating film 7. An example of material used for the gate insulating film 7 may be a silicon oxide ($SiO_2$) film, and other examples other than the $SiO_2$ film include a silicon oxynitride (SiON) film, a strontium oxide (SrO) film, a silicon nitride ($Si_3N_4$) film, and an aluminum oxide ($Al_2O_3$) film. Still other examples include a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film. Further, two or more of these single layers may be chosen and stacked on one another so as to be used as a composite film.

The gate electrodes 8c to 8e are buried in the respective trenches 6c to 6e via the gate insulating film 7. The gate insulating film 7 and the gate electrodes 8c to 8e implement trench gate structures (7, 8c), (7, 8d), and (7, 8e).

An example of material used for the gate electrodes 8a to 8e may be polysilicon (doped polysilicon) with which n-type impurity ions are doped at a high concentration, and other examples other than the doped polysilicon (DOPOS) include refractory metal such as tungsten (W), molybdenum (Mo), and titanium (Ti), and silicide of the refractory metal and the polysilicon. The material used for the gate electrodes 8a to 8e may be polycide which is a composite film of the polysilicon and the silicide of the refractory metal.

The detection element 102 illustrated on the left side in FIG. 3 partly includes the n⁻-type high specific-resistance layer 1 as a drift region. The detection element 102 also partly includes the n⁺-type low specific-resistance layer 11 deposited on the bottom surface of the drift region as the second main electrode region (the drain region). The p-type channel-formation regions 2a and 2b are deposited on the drift region. The n⁺-type first main electrode regions (the source regions) 3a to 3d are provided at the upper parts of the channel-formation regions 2a and 2b. The first main electrode regions 3a to 3d are connected to a detection electrode (a source electrode) 21 via contacts 21a and 21b. The detection electrode 21 is separated from the main electrode 22 of the output-stage element 101.

The detection element 102 illustrated on the left side in FIG. 3 is provided with trenches 6a to 6c penetrating the channel-formation regions 2a and 2b and having a depth to reach the high specific-resistance layer 1. The trenches 6a to 6c are in contact with the n⁺-type first main electrode regions (the source regions) 3a to 3d, the channel-formation regions 2a and 2b, and the high specific-resistance layer 1, and is in contact with a p-n junction between the n⁺-type first main electrode regions (the source regions) 3a to 3d and the channel-formation regions 2a and 2b and a p-n junction between the channel-formation regions 2a and 2b and the high specific-resistance layer 1. The inner surface of the respective trenches 6a to 6c is covered with the gate insulating film 7. The gate electrodes 8a to 8c are respectively buried in the trenches 6a to 6c via the gate insulating film 7. The gate insulating film 7 and the gate electrodes 8a to 8c implement trench gate structures (7, 8a), (7, 8b), and (7, 8c).

An insulating film 26 is deposited to cover the top surface of the respective gate electrodes 8a to 8e, the detection electrode 21, and the main electrode 22. The insulating film 26 may employ a single-layer film of an insulating film such as a silicon oxide ($SiO_2$) film or a stacked structure of insulating films, which may be determined depending on the arrangement position of the insulating film 26.

A predetermined voltage is applied to the gate electrodes 8a to 8e during the operation of the semiconductor device according to the first embodiment. The gate electrodes 8a to 8e electrostatically control a surface potential of the respective channel-formation regions 2a to 2e via the gate insulating film 7 so as to form an inversion channel in the channel-formation regions 2a to 2e. A current flows via the inversion channel between the respective first main electrode regions (the source regions) 3a to 3d and 4a to 4e and the second main electrode region (the drain region) defined by a part of the low specific-resistance layer 11 opposed to the first main electrode regions (the source regions) 3a to 3d and 4a to 4e.

Figure 4:
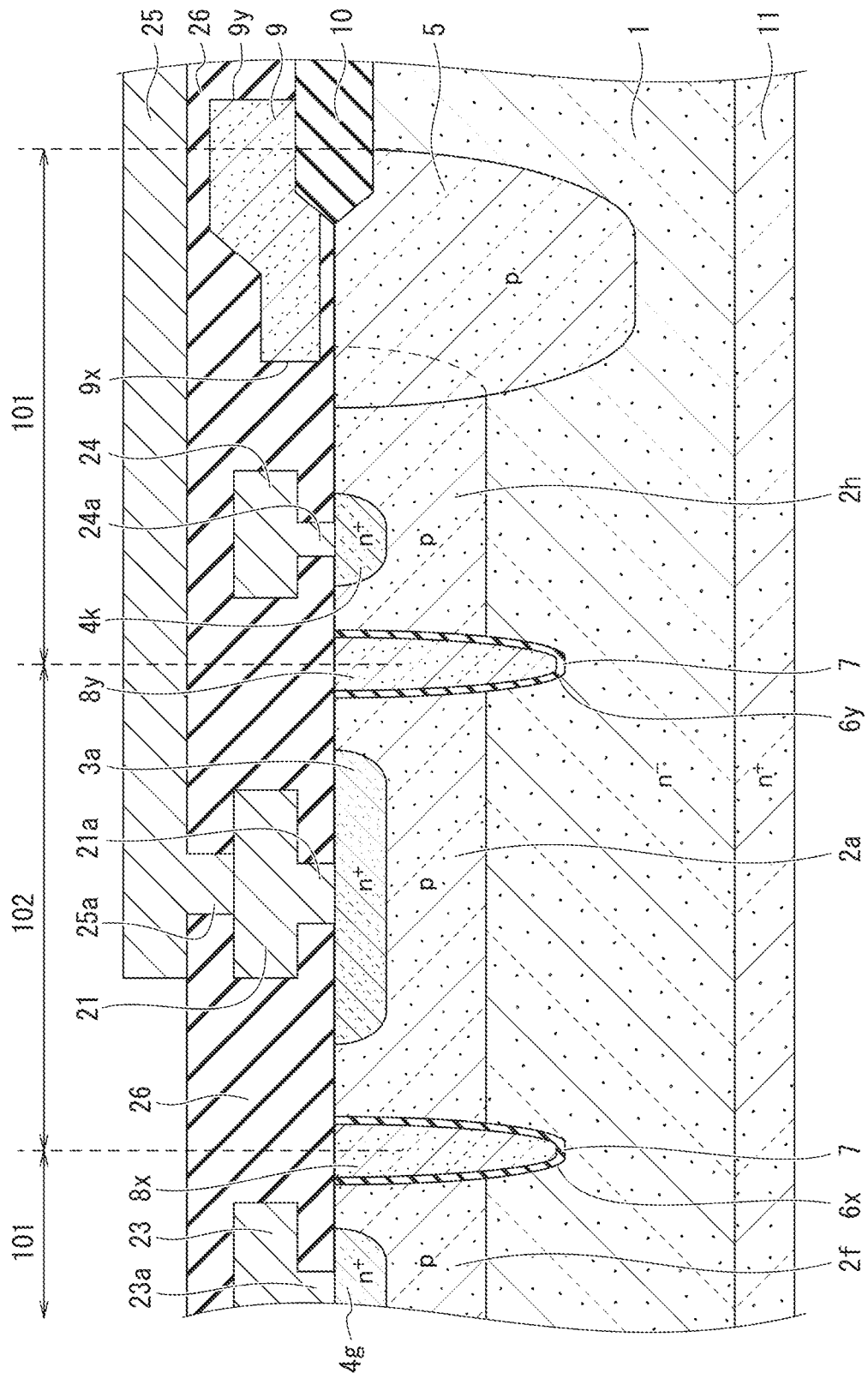
FIG. 4 is a cross-sectional view as viewed from direction B-B in FIG. 2.

FIG. 4 is a cross-sectional view as viewed from direction B-B in the upper-lower direction in FIG. 2. The detection element 102 illustrated in the middle in FIG. 4 is interposed between the right and left sides of the output-stage element 101 in FIG. 4. The detection element 102 illustrated in the middle in FIG. 4 is provided with the p-type channel-formation region 2a deposited on the n⁻-type high specific-resistance layer 1. The channel-formation region 2a is separated from the channel-formation regions 2f and 2h of the output-stage element 101 by the trenches 6x and 6y. The n⁺-type first main electrode region 3a is deposited at the upper part of the channel-formation region 2a.

The first main electrode region 3a is connected to the detection electrode 21 via the contact 21a. A source potential of the detection element 102 needs to be drawn toward the control circuit 103 separately from main electrodes 23 and 24. The detection electrode 21 is thus connected to an upper-layer wire 25 located above the detection electrode 21 via a contact 25a. The source potential of the detection element 102 is output to the control circuit 103 illustrated in FIG. 1 via the detection electrode 21 and the upper-layer wire 25. Although not illustrated in FIG. 4, a passivation film is provided to cover the upper-layer wire 25.

The output-stage element 101 on the right and left sides in FIG. 4 is provided with the p-type channel-formation regions 2f and 2h deposited at the upper parts of the n⁻-type high specific-resistance layer 1. The n⁺-type first main electrode regions 4g and 4k are deposited at the respective upper parts of the channel-formation regions 2f and 2h. The first main electrode region 4g is connected to the main electrode 23 via a contact 23a. The first main electrode region 4k is connected to the main electrode 24 via a contact 24a.

The output-stage element 101 illustrated on the right side in FIG. 4 is provided at a terminal region with an electric field relaxation region (a well region) 5 of p-type at the upper part of the n⁻-type high specific-resistance layer 1. The electric field relaxation region 5 is in contact with the channel-formation region 2h and is provided to have a depth deeper than the channel-formation region 2h. The electric field relaxation region 5 has an impurity concentration set to be higher than the impurity concentration of the channel-formation region 2h, for example, but may have the same impurity concentration as the channel-formation region 2h or may have a lower impurity concentration than the channel-formation region 2h.

A field insulating film 10 of a local insulating film (a LOCOS film) is provided in a part of the electric field relaxation region 5. The field insulating film 10 separates the output-stage element 101 and the control circuit 103 illustrated in FIG. 1 from each other. A gate wire 9 is provided on the electric field relaxation region 5 via the insulating film 26. FIG. 4 illustrates the case in which a left end part 9x of the gate wire 9 is located on the right side of the left side surface of the electric field relaxation region 5, and a right end part 9y of the gate wire 9 is located on the right side of the right side surface of the electric field relaxation region 5. The gate wire 9 may be integrally made of the same material as the gate electrodes 8a to 8e, for example.

As illustrated in FIG. 2, the gate wire 9 extends in the right-left direction in FIG. 2 in the planar pattern, and is located at the end part of the respective gate electrodes 8a to 8f in the longitudinal direction. FIG. 2 schematically indicates an end part 10x of the field insulating film 10 hidden under the gate wire 9 by the dashed and double-dotted line. FIG. 2 also schematically indicates end parts 5x and 5y of the electric field relaxation region 5 extending in parallel to each other by the dashed and dotted lines. The electric field relaxation region 5 is provided to cover the respective end parts of the gate electrodes 8a to 8f.

The position at the respective lower end parts of the channel-formation regions 2c to 2e, 2h, and 2i in the planar pattern in FIG. 2 is indicated by the thick dotted line. The position at the respective lower end parts of the channel-formation regions 2c to 2e, 2h, and 2i substantially conforms to the position of the end part 9x of the gate wire 9.

Figure 5:
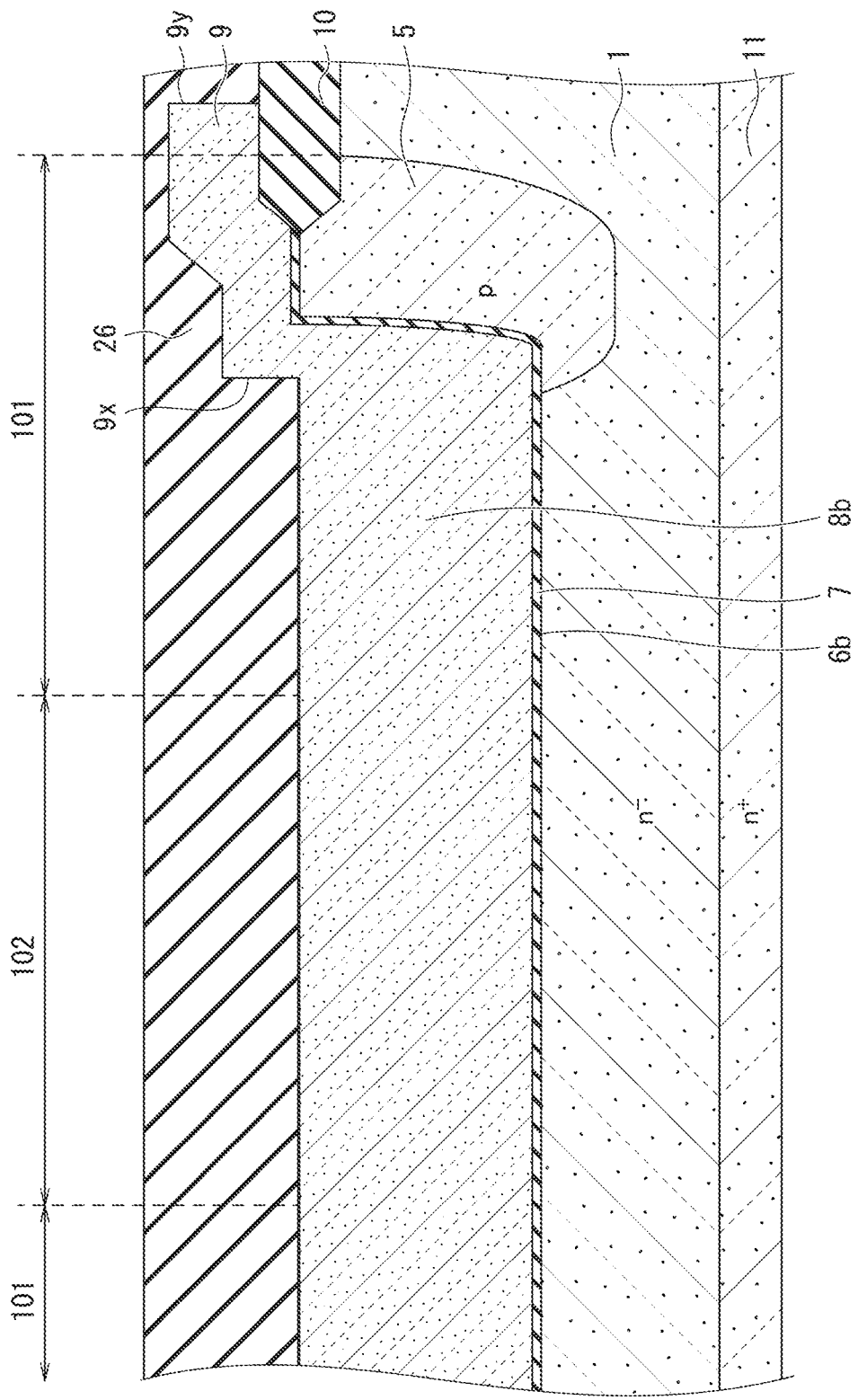
FIG. 5 is a cross-sectional view as viewed from direction C-C in FIG. 2.

FIG. 5 is a cross-sectional view as viewed from direction C-C in the upper-lower direction in FIG. 2. The trench 6b is provided to extend in the right-left direction at the upper part of the n⁻-type high specific-resistance layer 1 between the right and left sides of the output-stage element 101 across the detection element 102 illustrated in the middle in FIG. 5. The gate electrode 8b is buried in the trench 6b via the gate insulating film 7. The gate wire 9 is connected onto the right end part of the gate electrode 8b at the terminal region of the output-stage element 101 illustrated on the right side in FIG. 2. The side surface and the bottom surface of the right end part of the trench 6b are covered with the p-type electric field relaxation region 5.

First Comparative Example

Figure 6:
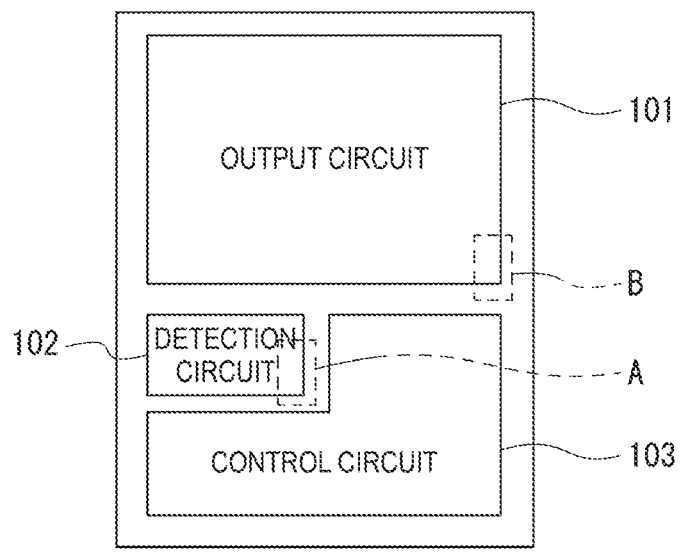
FIG. 6 is a plan view illustrating a semiconductor device of a first comparative example.

A semiconductor device of a first comparative example is described below. As illustrated in FIG. 6, the semiconductor device of the first comparative example has the structure common to the semiconductor device according to the first embodiment illustrated in FIG. 1 in including the output circuit (the output-stage element) 101, the detection circuit (the detection element) 102, and the control circuit 103 that are integrated on the same semiconductor chip. The semiconductor device of the first comparative example differs from the semiconductor device according to the first embodiment illustrated in FIG. 1 in that the detection element 102 is separated from the output-stage element 101, which is called a "separated-type" semiconductor device.

Figure 7:
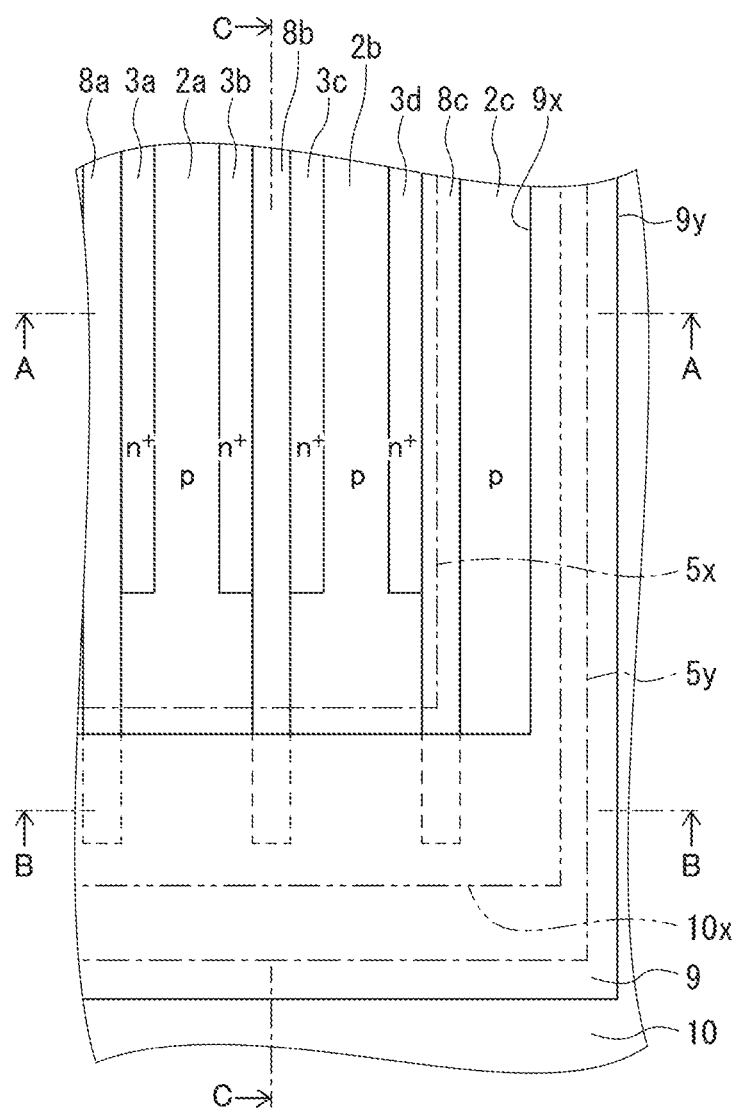
FIG. 7 is a plan view of region A in FIG. 6.

FIG. 7 is a plan view of region A surrounded by the broken line in FIG. 6 adjacent to the lower-right end part of the detection element 102. The plan view of region B surrounded by the broken line in FIG. 6 adjacent to the lower-right end part of the output-stage element 101 has a planar layout similar to FIG. 7 since the output-stage element 101 illustrated in FIG. 6 has a configuration similar to the detection element 102.

As illustrated in FIG. 7, the straight gate electrodes 8a to 8c extend in parallel to each other in the upper-lower direction in FIG. 7 adjacent to the lower-right end part of the detection element 102. The gate wire 9 is arranged on the respective end parts (indicated by the broken lines) of the gate electrodes 8a to 8c.

Figure 8:
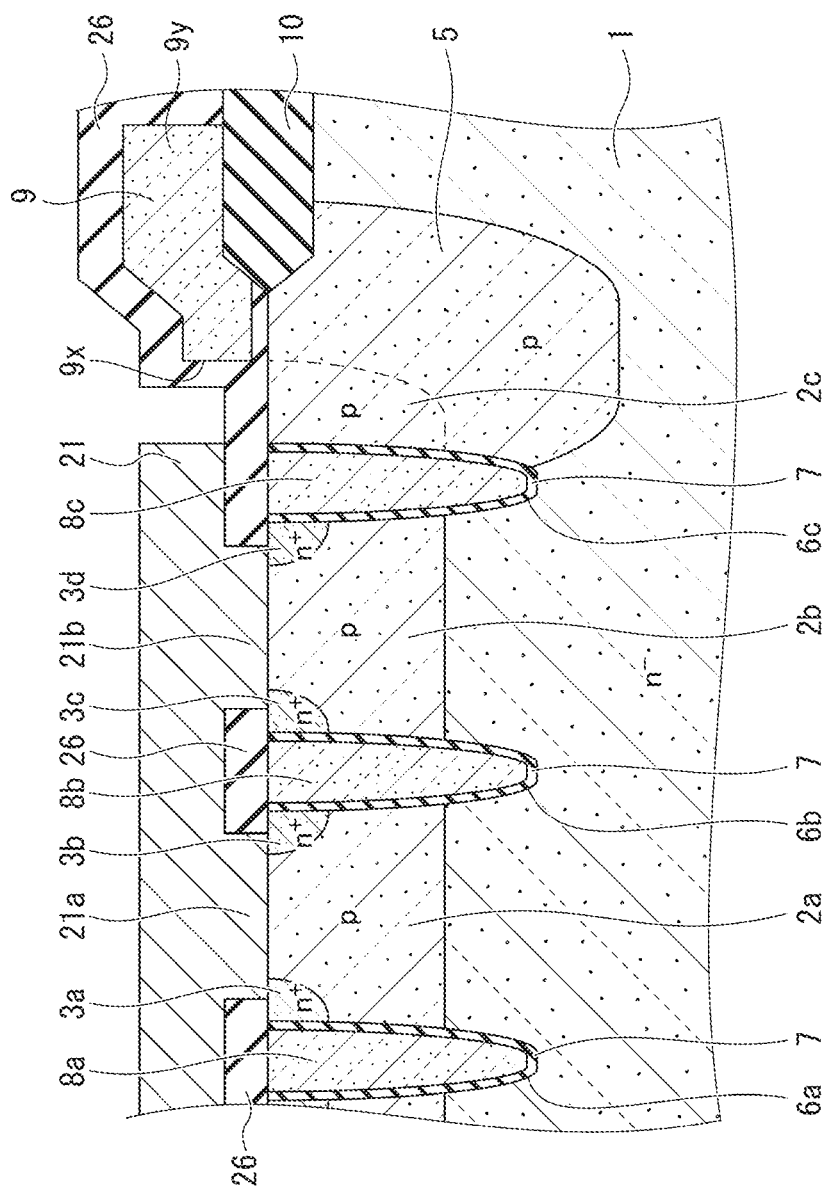
FIG. 8 is a cross-sectional view as viewed from direction A-A in FIG. 7.

FIG. 8 is a cross-sectional view as viewed from direction A-A in the right-left direction in FIG. 7. The p-type channel-formation regions 2a to 2c are deposited at the upper parts of the n⁻-type high specific-resistance layer 1. The n⁺-type first main electrode regions 3a to 3d are provided at the upper parts of the channel-formation regions 2a and 2b. The first main electrode regions 3a to 3d are connected to the detection electrode 21 via the contacts 21a and 21b. Although not illustrated in FIG. 8, a passivation film is provided to cover the detection electrode 21. The trenches 6a to 6c are provided to be in contact with the first main electrode regions 3a to 3d and the channel-formation regions 2a to 2c and have a depth to reach the high specific-resistance layer 1. The gate electrodes 8a to 8c are respectively buried in the trenches 6a to 6c via the gate insulating film 7. The insulating film 26 is provided to cover the top surface of the respective gate electrodes 8a to 8c and the gate wire 9.

The side surface and the bottom surface of the trench 6c located on the rightmost side in the detection element 102 is covered with the p-type electric field relaxation region 5. The field insulating film 10 is deposited on the top surface of the electric field relaxation region 5. FIG. 7 schematically indicates the end part 10x of the field insulating film 10 hidden under the gate wire 9 by the dashed and double-dotted line. FIG. 7 also schematically indicates the end parts 5x and 5y of the electric field relaxation region 5 having an L-shaped planar pattern in parallel to each other by the dashed and dotted lines. The electric field relaxation region 5 is provided to cover the right side of the trench 6c and the respective lower end parts of the trenches 6a to 6c.

Figure 9:
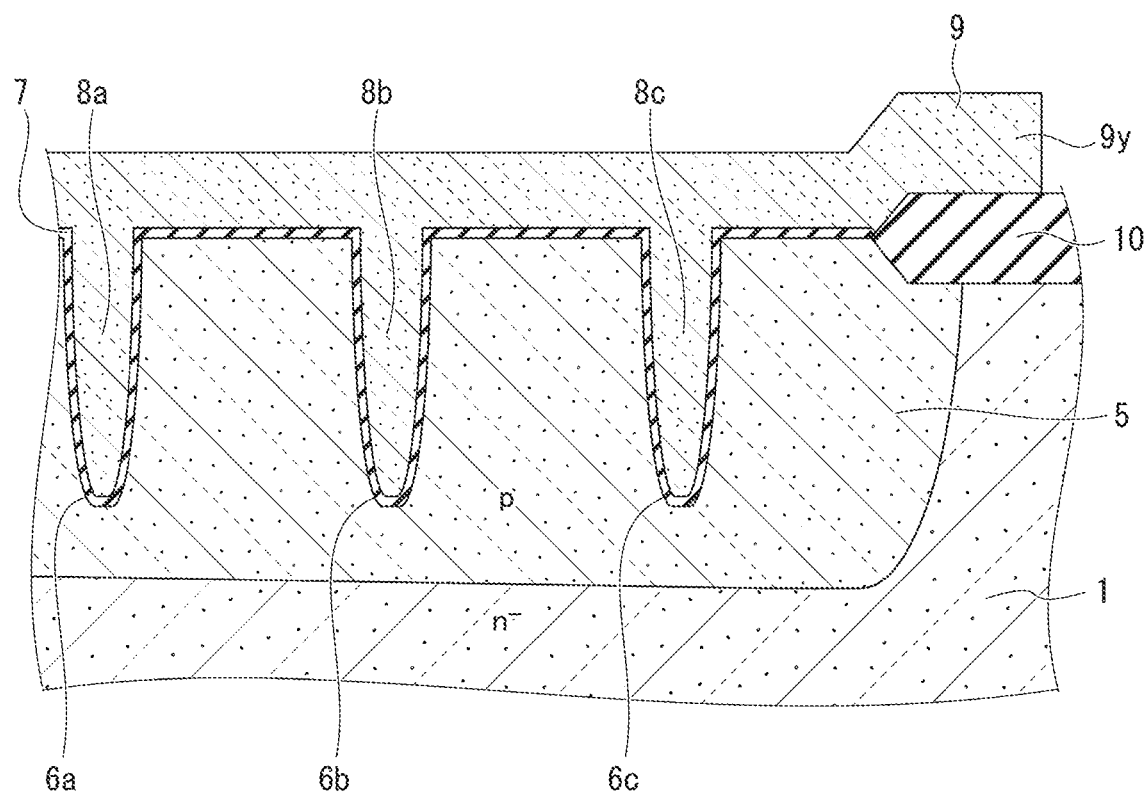
FIG. 9 is a cross-sectional view as viewed from direction B-B in FIG. 7.

FIG. 9 is a cross-sectional view as viewed from direction B-B in the right-left direction in FIG. 7. FIG. 9 illustrates the region adjacent to the respective end parts of the trenches 6a to 6c. The gate wire 9 is connected to the top surface of the respective gate electrodes 8a to 8c buried in the trenches 6a to 6c via the gate insulating film 7. The side surface and the bottom surface adjacent to the respective end parts of the trenches 6a to 6c are covered with the p-type electric field relaxation region 5.

Figure 10:
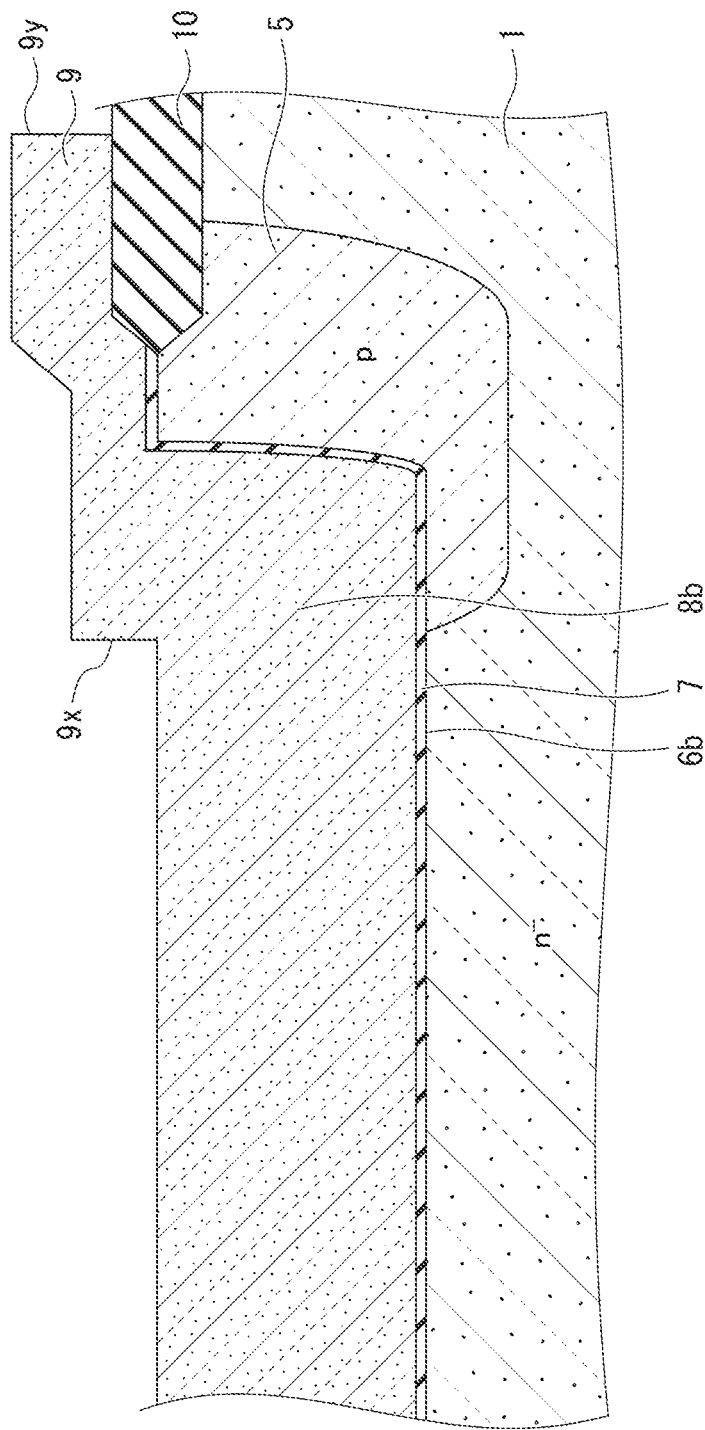
FIG. 10 is a cross-sectional view as viewed from direction C-C in FIG. 7.

FIG. 10 is a cross-sectional view as viewed from direction C-C in the upper-lower direction in FIG. 7. The trench 6b extends in the right-left direction in FIG. 10. The side surface and the bottom surface of the right end part of the trench 6b are covered with the p-type electric field relaxation region 5.

As illustrated in FIG. 7 to FIG. 10, in the semiconductor device of the first comparative example, since the detection element 102 includes the end parts of the trenches 6a to 6c, the electric field relaxation region 5 needs to be provided to cover the end parts of the trenches 6a to 6c so as to avoid an electric field concentration at the end parts of the trenches 6a to 6c. In contrast, as illustrated in FIG. 2 to FIG. 5, the semiconductor device according to the first embodiment includes the gate electrodes 8x and 8y intersecting with the gate electrodes 8a to 8f to separate the channel-formation regions 2a and 2b of the detection element 102 and the channel-formation regions 2c and 2f to 2i of the output-stage element 101 from each other. The detection element 102, which is surrounded at the circumference by the output-stage element 101, thus does not include the end parts of the gate electrodes 8a to 8c, so as to exclude the electric field relaxation region 5 as used in the semiconductor device of the first comparative example.

Second Comparative Example

Figure 11:
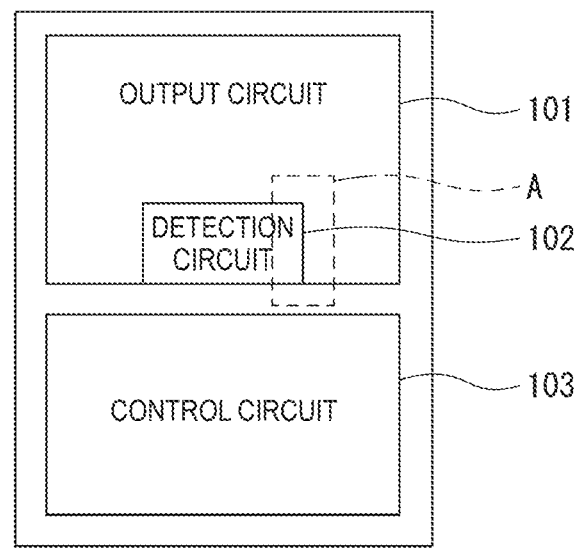
FIG. 11 is a plan view illustrating a semiconductor device of a second comparative example.

A semiconductor device of a second comparative example is described below. As illustrated in FIG. 11, the semiconductor device of the second comparative example has the structure common to the semiconductor device according to the first embodiment illustrated in FIG. 1 in including the output circuit (the output-stage element) 101, the detection circuit (the detection element) 102, and the control circuit 103 that are integrated on the same semiconductor chip, and in having a configuration in which the detection element 102 is buried in the output-stage element 10, which is called a "buried-type" semiconductor device. The semiconductor device of the second comparative example differs from the semiconductor device according to the first embodiment illustrated in FIG. 1 in that the detection element 102 is arranged at the end part of the output-stage element 101 so that the output-stage element 101 is located only on one side of the detection element 102 in the longitudinal direction of the trenches.

Figure 12:
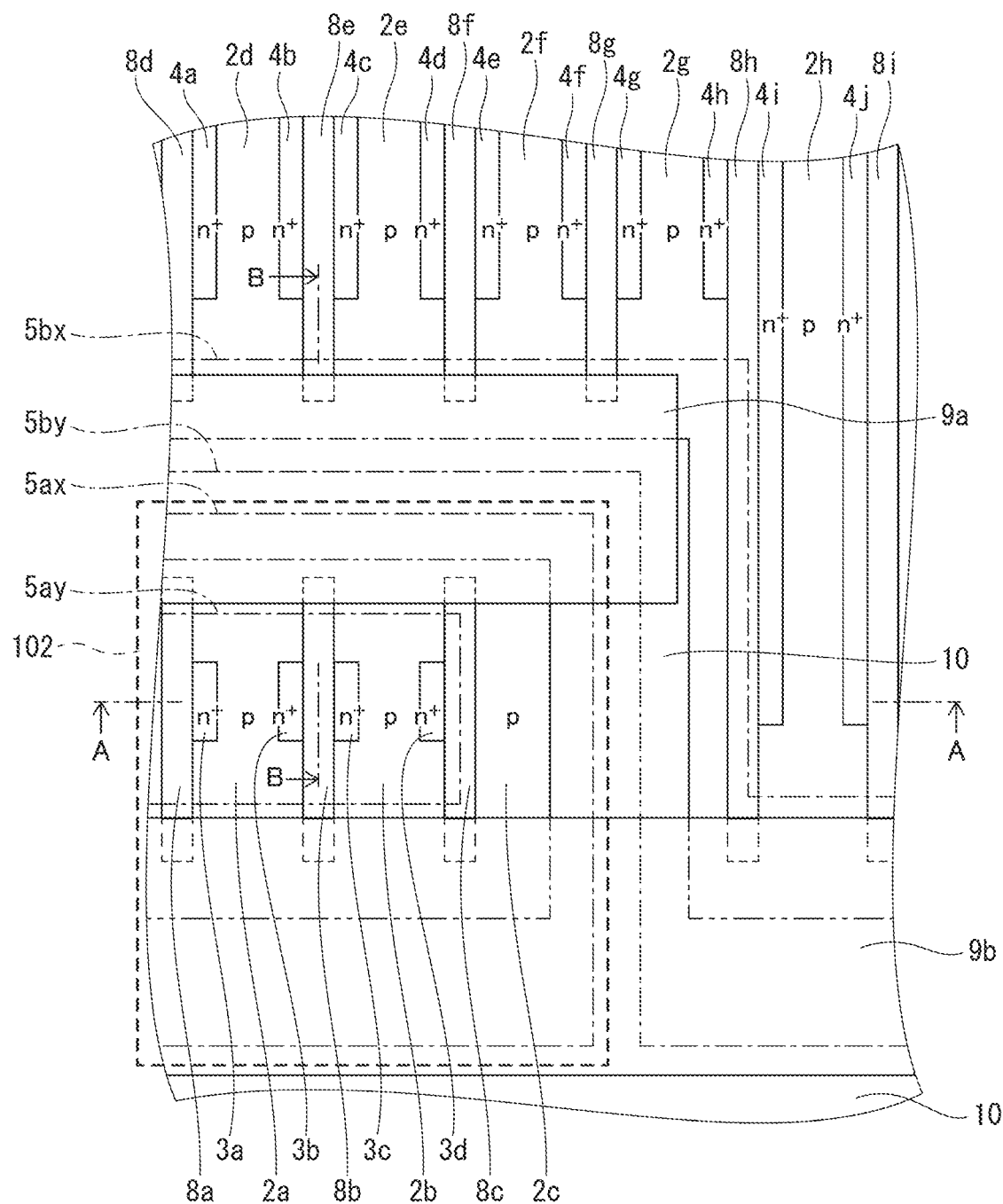
FIG. 12 is a plan view of region A in FIG. 11.

FIG. 12 is a plan view of region A surrounded by the broken line in FIG. 11 adjacent to the right end part of the detection element 102. As illustrated in FIG. 12, the detection element 102 includes the straight gate electrodes 8a to 8c arranged to extend in parallel to each other in the upper-lower direction in FIG. 12 in a planar pattern. The n+-type first main electrode regions 3a to 3d are provided on the respective side surfaces of the gate electrodes 8a to 8c via the gate insulating film (not illustrated). The output-stage element 101 includes the straight gate electrodes 8d to 8i arranged to extend in parallel to each other. The n+-type first main electrode regions 4a to 4j are provided on the respective side surfaces of the gate electrodes 8d to 8i via the gate insulating film (not illustrated).

Figure 13:
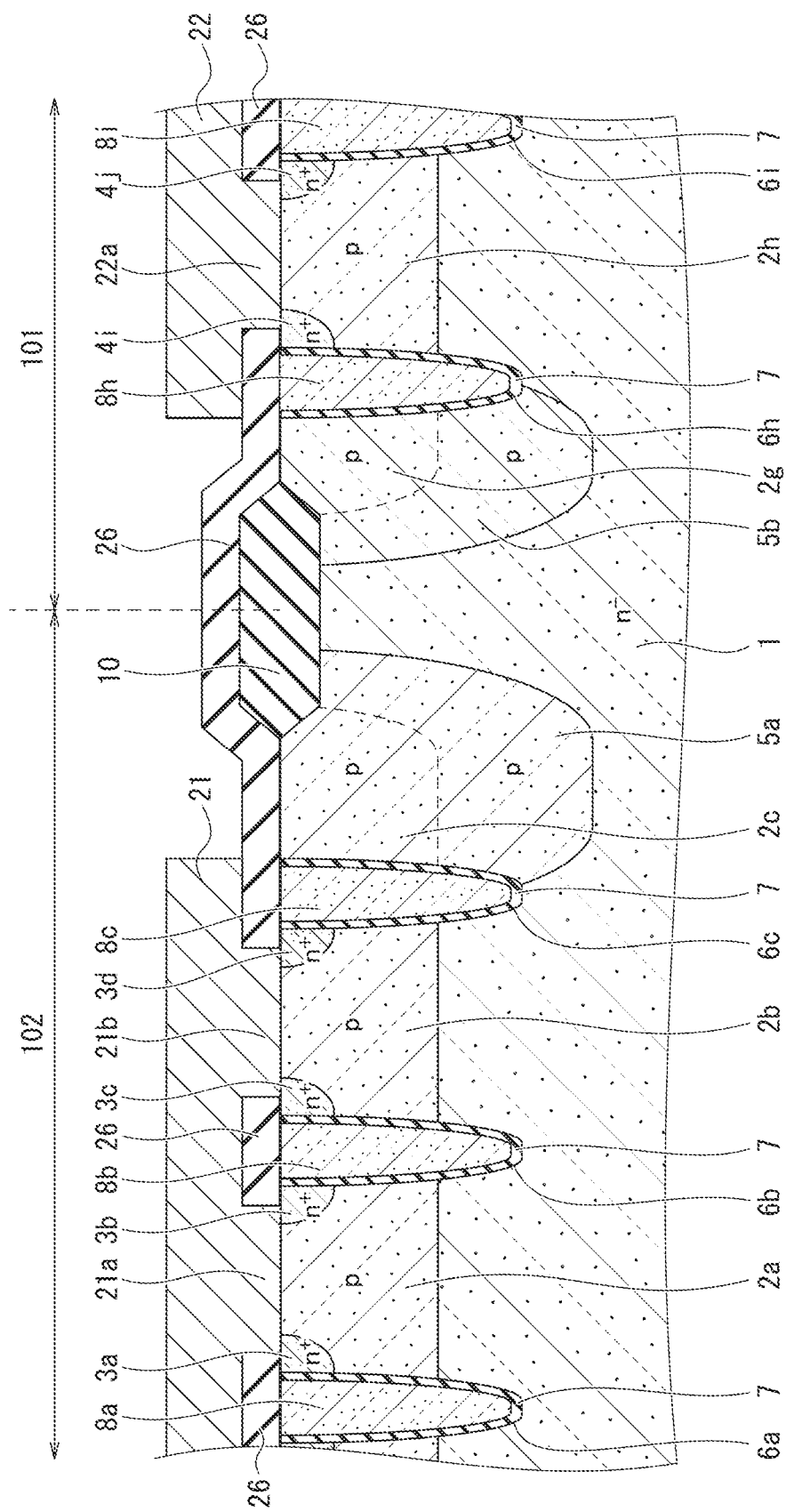
FIG. 13 is a cross-sectional view as viewed from direction A-A in FIG. 12.

FIG. 13 is a cross-sectional view as viewed from direction A-A in the right-left direction in FIG. 12. The detection element 102 illustrated on the left side in FIG. 13 is provided with the p-type channel-formation regions 2a to 2c deposited at the upper parts of the n−-type high specific-resistance layer 1. The n+-type first main electrode regions 3a to 3d are provided at the upper parts of the channel-formation regions 2a and 2b. The first main electrode regions 3a to 3d are connected to the detection electrode 21 via the contacts 21a and 21b. The trenches 6a to 6c are provided to be in contact with the first main electrode regions 3a to 3d and the channel-formation regions 2a and 2b and have a depth to reach the high specific-resistance layer 1. The gate electrodes 8a to 8c are respectively buried in the trenches 6a to 6c via the gate insulating film 7. The side surface and the bottom surface of the right end part of the trench 6c are covered with a p-type electric field relaxation region 5a.

The output-stage element 101 illustrated on the right side in FIG. 13 is provided with the p-type channel-formation regions 2g and 2h at the upper parts of the n−-type high specific-resistance layer 1. The n+-type first main electrode regions 4i and 4j are provided at the upper parts of the channel-formation region 2h. The first main electrode regions 4i and 4j are connected to the main electrode 22 via the contact 22a. The trenches 6h and 6i are provided to penetrate the channel-formation regions 2g and 2h and have a depth to reach the high specific-resistance layer 1. The gate electrodes 8h and 8i are respectively buried in the trenches 6h and 6i via the gate insulating film 7. The side surface and the bottom surface on the left side of the trench 6h are covered with a p-type electric field relaxation region 5b.

The electric field relaxation regions 5a and 5b are provided separately from each other. The field insulating film 10 is deposited on the high specific-resistance layer 1 interposed between the respective electric field relaxation regions 5a and 5b. The insulating film 26 is provided on the respective top surfaces of the gate electrodes 8a to 8c, 8h, and 8i, the electric field relaxation regions 5a and 5b, and the field insulating film 10. Although not illustrated in FIG. 13, a passivation film is provided to cover the detection electrode 21 and the main electrode 22.

FIG. 12 schematically indicates end parts Sax and Say of the p-type electric field relaxation region 5a by the dashed and dotted line. FIG. 12 also schematically indicates end parts 5bx and 5by of the p-type electric field relaxation region 5b by the dashed and dotted line. FIG. 12 further schematically indicates the part of the field insulating film 10 hidden under gate wires 9a and 9b by the dashed and double-dotted line.

The p-type electric field relaxation region 5a has a planar pattern interposed between the end parts Sax and Say so as to surround the circumference of the detection element 102. The p-type electric field relaxation region 5a covers both ends of the respective trenches 6a to 6c in the longitudinal direction included in the detection element 102. The p-type electric field relaxation region 5b has a planar pattern interposed between the end parts 5bx and 5by so as to surround the circumference of the output-stage element 101. The p-type electric field relaxation region 5b covers both ends of the respective trenches 6d to 6i in the longitudinal direction included in the output-stage element 101. The field insulating film 10 is provided along a region between the end part Sax of the electric field relaxation region 5a and the end part 5by of the electric field relaxation region 5b. The field insulating film 10 thus separates the output-stage element 101 and the detection element 102 from each other.

Figure 14:
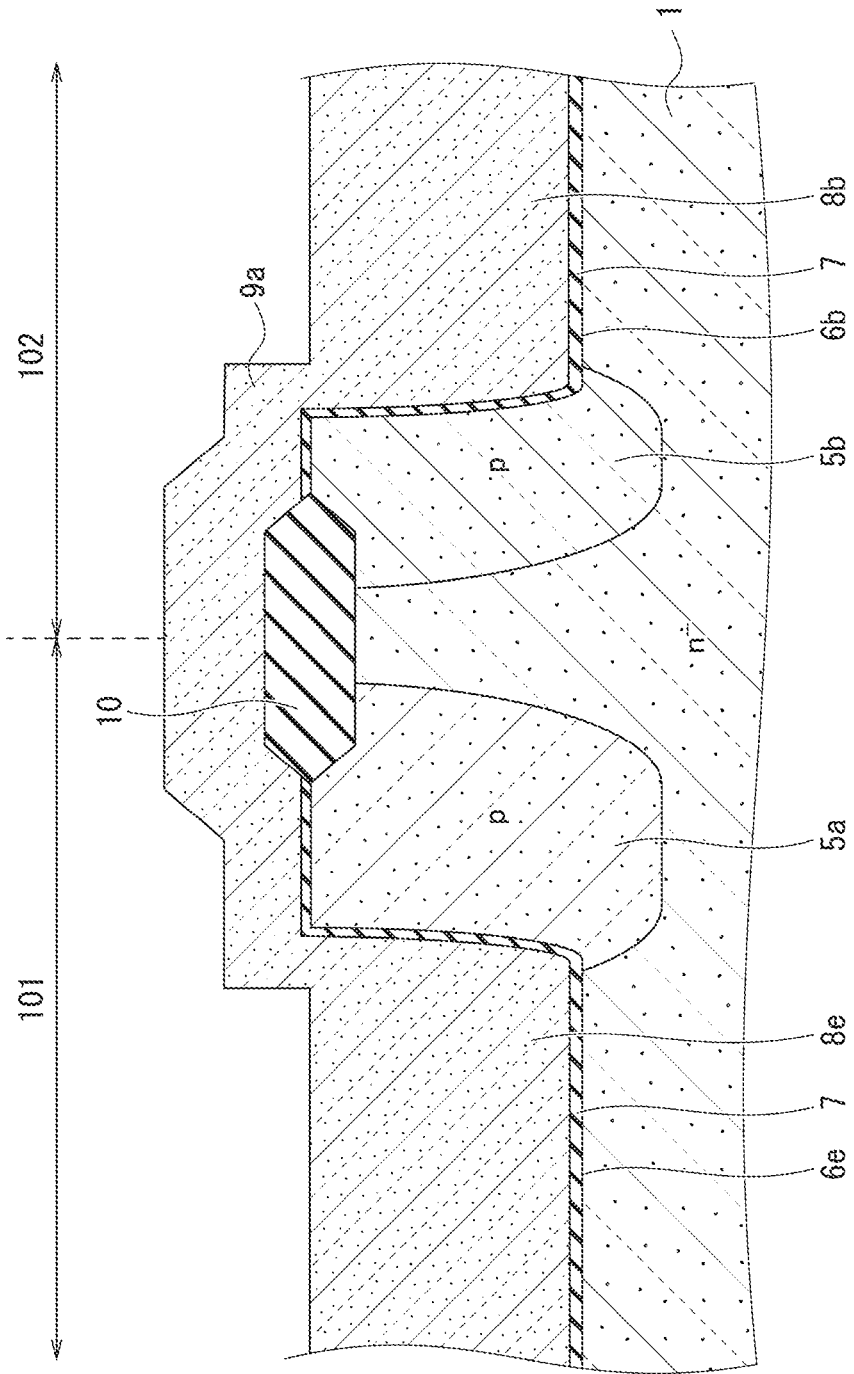
FIG. 14 is a cross-sectional view as viewed from direction B-B in FIG. 12.

FIG. 14 is a cross-sectional view as viewed from direction B-B in the upper-lower direction in FIG. 12. The trench 6e extends in the right-left direction in the output-stage element 101 illustrated on the left side in FIG. 14. The gate electrode 8e is buried in the trench 6e via the gate insulating film 7. The gate electrode 8e is connected to the gate wire 9a. The side surface and the bottom surface of the right end part of the trench 6e is covered with the p-type electric field relaxation region 5a.

The trench 6b extends in the right-left direction in the detection element 102 illustrated on the right side in FIG. 14. The gate electrode 8b is buried in the trench 6b via the gate insulating film 7. The gate electrode 8b is connected to the gate wire 9a. The side surface and the bottom surface of the left end part of the trench 6b is covered with the p-type electric field relaxation region 5b. The field insulating film 10 is deposited on the high specific-resistance layer 1 interposed between the respective electric field relaxation regions 5a and 5b. The gate wire 9a is deposited on the field insulating film 10 to connect the respective gate electrodes 8b and 8e.

As illustrated in FIG. 12 to FIG. 14, the semiconductor device of the second comparative example needs to divide the trenches into the trenches 6d to 6f in the output-stage element 101 and the trenches 6a to 6c in the detection element 102 so as to separate the channel-formation regions 2d and 2e in the output-stage element 101 from the channel-formation regions 2a and 2b in the detection element 102. The semiconductor device of the second comparative example also needs to include the electric field relaxation regions 5a and 5b so as to relax the electric field concentration at the end parts of the trenches 6d to 6f in the longitudinal direction in the output-stage element 101 and the end parts of the trenches 6a to 6c in the longitudinal direction in the detection element 102.

In contrast, as illustrated in FIG. 2 to FIG. 5, the semiconductor device according to the first embodiment includes the gate electrodes 8x and 8y intersecting with the gate electrodes 8a to 8f to separate the channel-formation regions 2a and 2b of the detection element 102 and the channel-formation regions 2c and 2f to 2i of the output-stage element 101 from each other. This configuration does not need to separate the trenches 6a to 6f between the output-stage element 101 and the detection element 102, so as to use the gate electrodes 8a to 8f in common with each other. The detection element 102, which is surrounded at the circumference by the output-stage element 101, thus does not include the end parts of the trenches 6a to 6c in the longitudinal direction, so as to exclude the electric field relaxation regions 5a and 5b as used in the semiconductor device of the second comparative example.

Second Embodiment

A semiconductor device according to a second embodiment has a schematic layout similar to that of the semiconductor device of the second comparative example illustrated in FIG. 11. As illustrated in FIG. 11, the semiconductor device according to the second embodiment has the structure common to the semiconductor device according to the first embodiment illustrated in FIG. 1 in including the output-stage element 101, the detection element 102, and the control circuit 103 that are integrated on the same semiconductor chip, and in having a configuration in which the detection element 102 is buried in the output-stage element 101, which is called a "buried-type" semiconductor integrated circuit. The semiconductor device according to the second embodiment differs from the semiconductor device according to the first embodiment illustrated in FIG. 1 in that the detection element 102 is arranged at the end part of the output-stage element 101 so that the output-stage element 101 is located only on one side of the detection element 102 in the longitudinal direction of the trenches.

Figure 15:
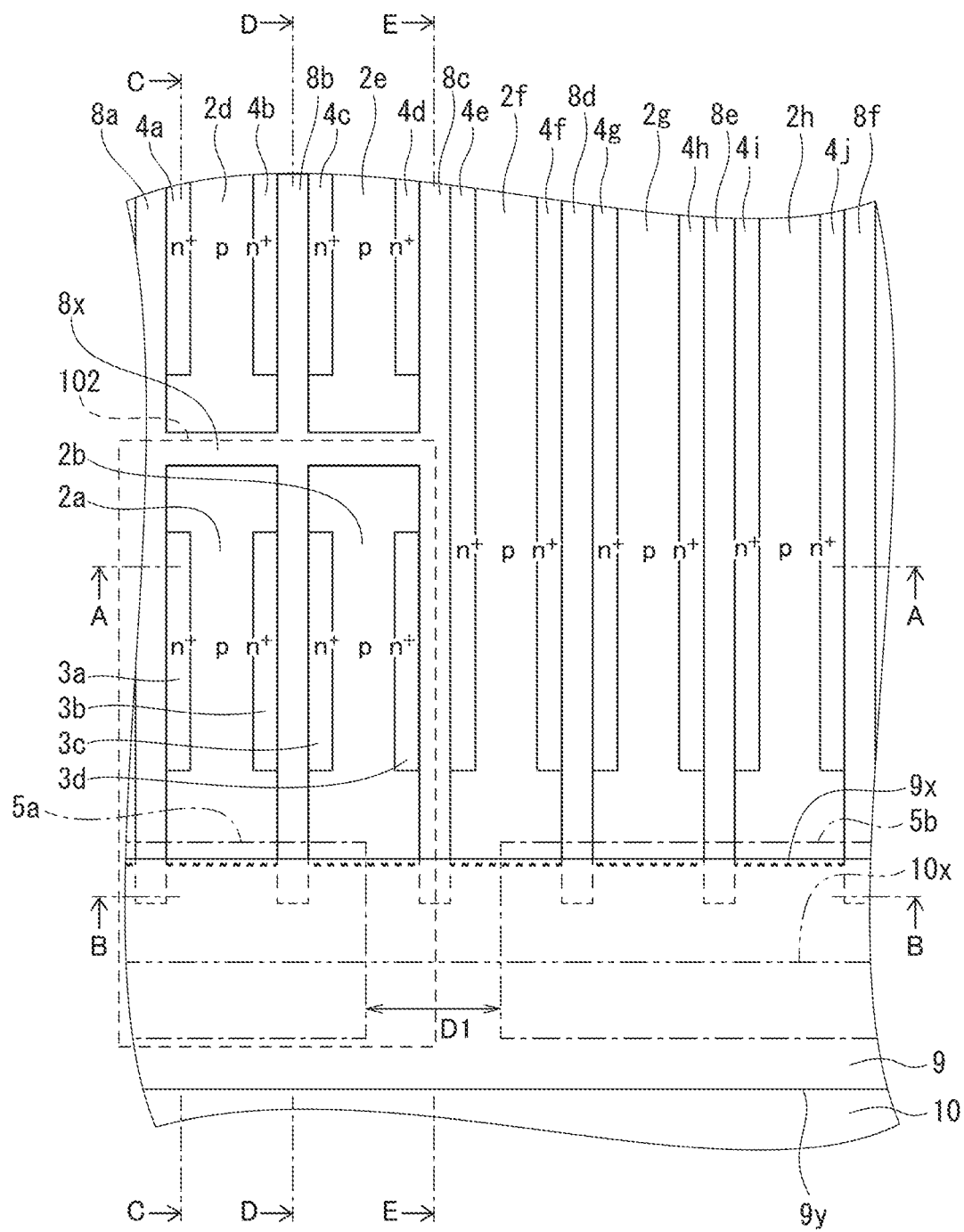
FIG. 15 is a plan view illustrating a main part of a semiconductor device according to a second embodiment.

FIG. 15 is a plan view of region A surrounded by the broken line in FIG. 11 adjacent to the right end part of the detection element 102. The region adjacent to the left end part of the detection element 102 illustrated in FIG. 11 has a symmetrical planar layout similar to FIG. 15.

As illustrated in FIG. 15, the semiconductor device according to the second embodiment includes the straight gate electrodes 8a to 8f arranged to extend in parallel to each other in the upper-lower direction in FIG. 15 in the planar pattern. The straight gate electrode 8x is arranged to extend in the right-left direction in FIG. 15 perpendicular to the respective gate electrodes 8a to 8f While FIG. 15 illustrates the case of including the single gate electrode 8x, a plurality of gate electrodes may be provided to extend in parallel to each other at the position of the gate electrode 8x. The respective gate electrodes 8a to 8f and 8x are buried in the trenches via the gate insulating film (not illustrated).

The region adjacent to the right end part of the detection element 102 is defined by the gate electrodes 8c and 8x so as to be separated from the output-stage element 101. The gate electrode 8x extends from the right end part to the left end part of the detection element 102. Although not illustrated, the region adjacent to the left end part of the detection element 102 is defined by the gate electrode 8x and another gate electrode extending in parallel to the gate electrode 8c so as to be separated from the output-stage element 101.

The detection element 102 includes the p-type channel-formation regions 2a and 2b, the n$^+$-type first main electrode regions 3a to 3d arranged in contact with the upper parts of the channel-formation regions 2a and 2b, and the gate electrodes 8a to 8c with the side surfaces in contact with the first main electrode regions 3a to 3d via the gate insulating film (not illustrated). The output-stage element 101 includes the p-type channel-formation regions 2d to 2h, the n$^+$-type first main electrode regions 4a to 4j arranged in contact with the upper parts of the channel-formation regions 2d to 2h, and the gate electrodes 8a to 8f with the side surfaces in contact with the first main electrode regions 4a to 4j via the insulating film (not illustrated). The gate electrodes 8a to 8c are used in common with the detection element 102 and the output-stage element 101.

The position at the respective lower end parts of the channel-formation regions 2a, 2b, and 2f to 2h in the planar pattern in FIG. 15 is indicated by the thick dotted line. The position at the respective lower end parts of the channel-formation regions 2a, 2b, and 2f to 2h substantially conforms to the position of the end part 9x of the gate wire 9.

Figure 16:
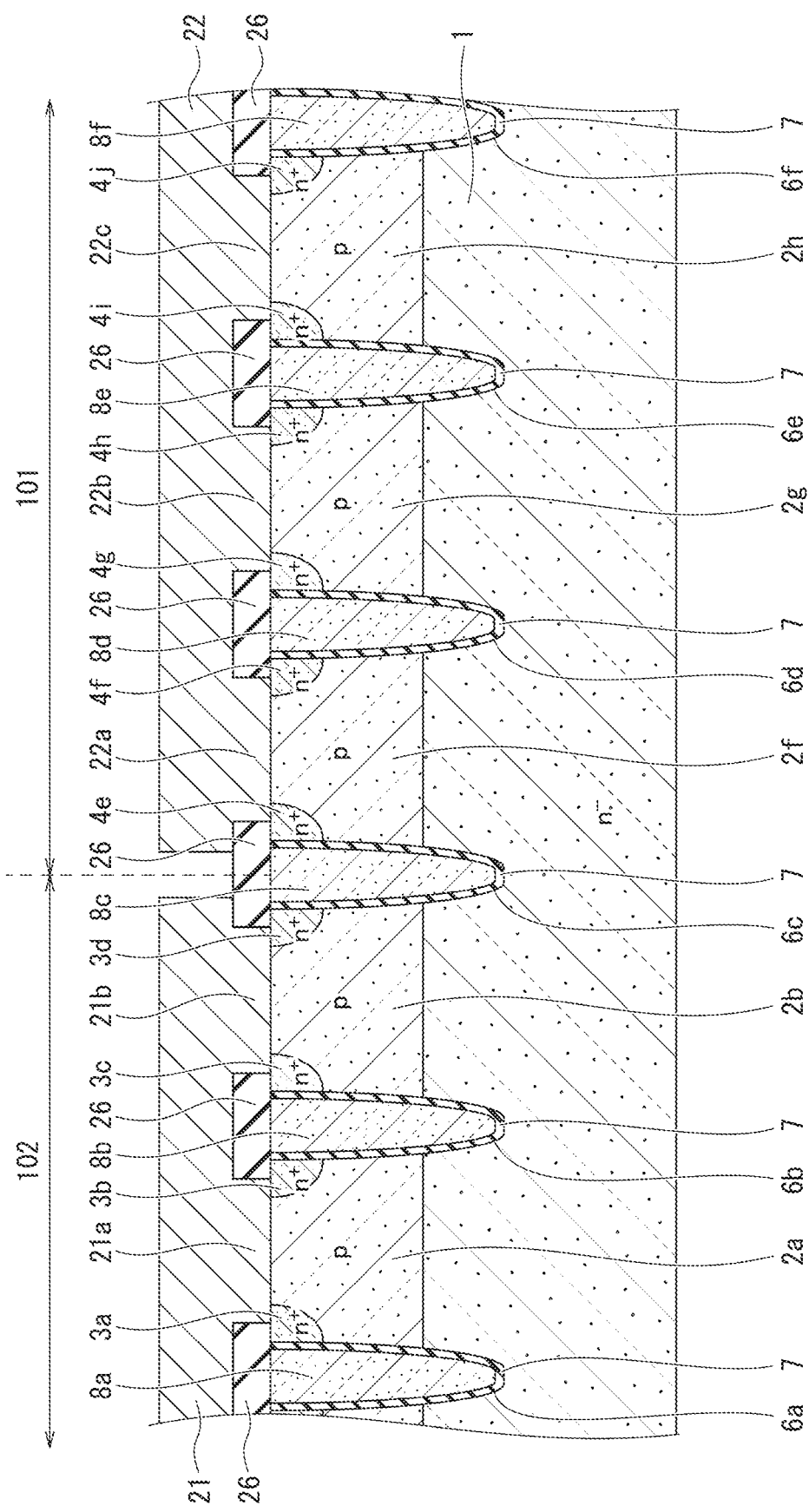
FIG. 16 is a cross-sectional view as viewed from direction A-A in FIG. 15.

FIG. 16 is a cross-sectional view as viewed from direction A-A in the right-left direction in FIG. 15. The p-type channel-formation regions 2f to 2h are deposited on the n$^-$-type high specific-resistance layer 1 in the output-stage element 101 illustrated on the right side in FIG. 16. The n$^+$-type first main electrode regions (the source regions) 4e to 4j are provided at the upper parts of the channel-formation regions 2f to 2h. The first main electrode regions 4e to 4j are connected to the main electrode 22 via the contacts 22a to 22c. The trenches 6c to 6f are provided to penetrate the channel-formation regions 2f to 2h and have a depth to reach the high specific-resistance layer 1. The trenches 6c to 6f are in contact with the n$^+$-type first main electrode regions 4e to 4j, the channel-formation regions 2f to 2h, and the high specific-resistance layer 1, and is in contact with a p-n junction between the n$^+$-type first main electrode regions 4e to 4j and the channel-formation regions 2f to 2h and a p-n junction between the channel-formation regions 2f to 2h and the high specific-resistance layer 1. The gate electrodes 8c to 8f are respectively buried in the trenches 6c to 6f via the gate insulating film 7.

The p-type channel-formation regions 2a and 2b are deposited on the n$^-$-type high specific-resistance layer 1 in the detection element 102 illustrated on the left side in FIG. 16. The n$^+$-type first main electrode regions 3a to 3d are provided at the upper parts of the channel-formation regions 2a and 2b. The first main electrode regions 3a to 3d are connected to the detection electrode 21 via the contacts 21a and 21b. The trenches 6a to 6c are provided to penetrate the channel-formation regions 2a and 2b and have a depth to reach the high specific-resistance layer 1. The trenches 6a to 6c are in contact with the n$^+$-type first main electrode regions 3a to 3d, the channel-formation regions 2a and 2b, and the high specific-resistance layer 1, and is in contact with a p-n junction between the n$^+$-type first main electrode regions 3a to 3d and the channel-formation regions 2a and 2b and a p-n junction between the channel-formation regions 2a and 2b and the high specific-resistance layer 1. The gate electrodes 8a to 8c are respectively buried in the trenches 6a to 6c via the gate insulating film 7.

The trench 6c separates the output-stage element 101 and the detection element 102 from each other, and is used in common with the output-stage element 101 and the detection element 102. Although not illustrated in FIG. 16, the n$^+$-type low specific-resistance layer is deposited on the bottom surface of the high specific-resistance layer 1, as in the case of the semiconductor device according to the first embodiment. The low specific-resistance layer partly serves as the second main electrode region (the drain region) for each of the output-stage element 101 and the detection element 102.

The insulating film 26 is deposited on the respective top surfaces of the gate electrodes 8a to 8f Although not illustrated in FIG. 16, a passivation film is provided to cover the detection electrode 21 and the main electrode 22.

Figure 17:
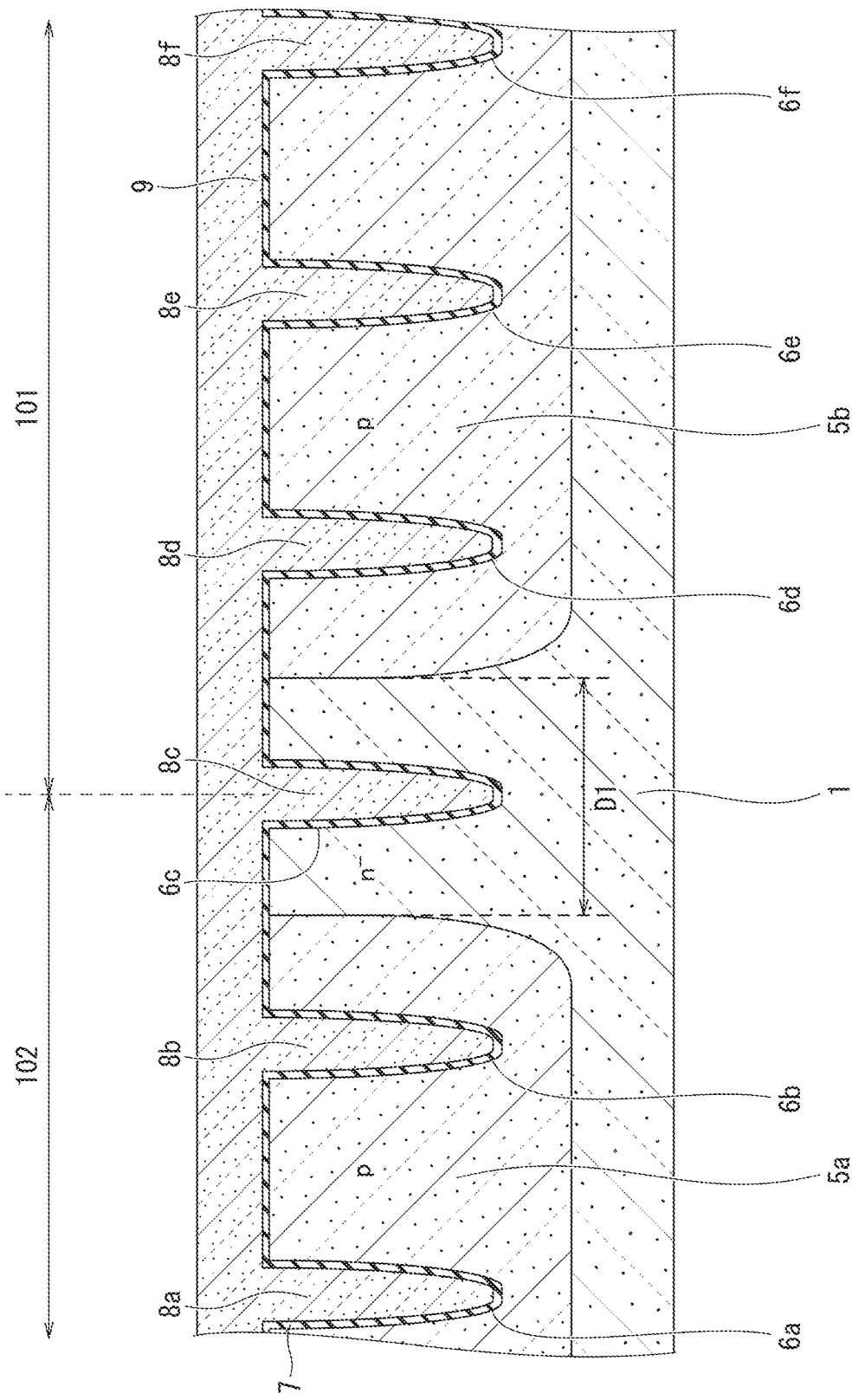
FIG. 17 is a cross-sectional view as viewed from direction B-B in FIG. 15.

FIG. 17 is a cross-sectional view as viewed from direction B-B in the right-left direction in FIG. 15. FIG. 17 illustrates the region adjacent to the respective end parts of the trenches 6a to 6f in the longitudinal direction. Since the respective end parts of the detection element 102 and the output-stage element 101 are aligned with each other (conform to each other), the detection element 102 includes the end parts of the trenches 6a to 6c in the longitudinal direction, as illustrated on the left side in FIG. 17. The side surface and the bottom surface adjacent to the respective end parts of the trenches 6a and 6b in the longitudinal direction are covered with the p-type electric field relaxation region 5a. The output-stage element 101 illustrated on the right side in FIG. 17 includes the end parts of the trenches 6c to 6f in the longitudinal direction. The side surface and the bottom surface adjacent to the respective end parts of the trenches 6d to 6f in the longitudinal direction are covered with the p-type electric field relaxation region 5b.

The electric field relaxation regions 5a and 5b are separated from each other so as to prevent the channel-formation region 2b located on the rightmost side in the detection element 102 and the channel-formation region 2c located on the leftmost side in the output-stage element 101 from being electrically short-circuited. An electric field concentration may be caused at the region adjacent to the end part of the trench 6c in the longitudinal direction located between the electric field relaxation regions 5a and 5b but not covered with the electric field relaxation regions 5a and 5b, which may decrease a breakdown voltage.

To deal with this, a distance D1 between the respective electric field relaxation regions 5a and 5b is set so as to connect depletion layers extending from the p-n junctions between the drift region of the high specific-resistance layer 1 and the respective electric field relaxation regions 5a and 5b when a high voltage different from a case in normal operation is applied between the drain and the source of the output-stage element 101 and the detection element 102.

Setting the distance D1 can relax the electric field at the end part of the trench 6c in the longitudinal direction, so as to prevent a decrease in the breakdown voltage. When the breakdown voltage is about 60 volts, for example, the distance D1 between the respective electric field relaxation regions 5a and 5b is preferably set in a range of about one micrometer or greater and three micrometers or less.

Figure 18:
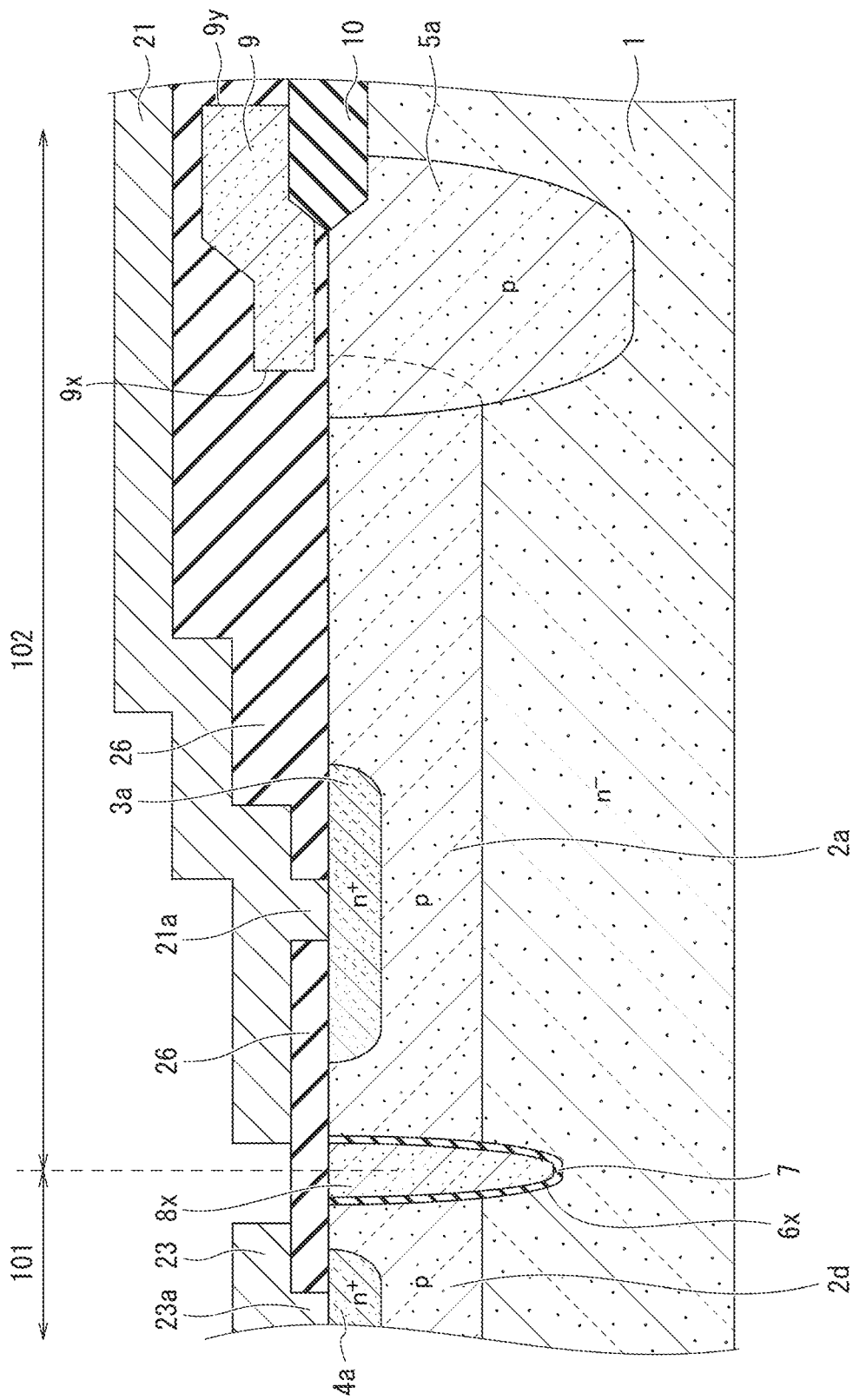
FIG. 18 is a cross-sectional view as viewed from direction C-C in FIG. 15.

FIG. 18 is a cross-sectional view as viewed from direction C-C in the upper-lower direction in FIG. 15. The output-stage element 101 illustrated on the left side in FIG. 18 is provided with the p-type channel-formation region 2d deposited on the n$^-$-type high specific-resistance layer 1. The n$^+$-type first main electrode region 4a is deposited at the upper part of the channel-formation region 2d. The first main electrode region 4a is connected to the main electrode 23 via the contact 23a.

The detection element 102 illustrated on the right side in FIG. 18 is provided with the p-type channel-formation region 2a deposited on the n$^-$-type high specific-resistance layer 1. The n$^+$-type first main electrode region 3a is deposited at the upper part of the channel-formation region 2a. The first main electrode region 3a is connected to the detection electrode 21 via the contact 21a. Although not illustrated in FIG. 18, a passivation film is provided to cover the detection electrode 21 and the main electrode 23.

Since the detection electrode 21 is not surrounded completely by the main electrode 23 of the output-stage element 101 and the like, the source potential of the detection element 102 can be drawn toward the control circuit 103 via the detection electrode 21 in the same layer (the first layer) as the main electrode 23. The semiconductor device according to the second embodiment thus does not need to have a multi-layer wiring structure for extracting the source potential, as compared with the semiconductor device according to the first embodiment.

The side surface and the bottom surface of the right end part of the channel-formation region 2a is covered with the p-type electric field relaxation region 5a. The field insulating film 10 is deposited on the top surface of the electric field relaxation region 5a. The gate wire 9 is provided on the top surface of the electric field relaxation region 5a via the insulating film 26. As illustrated in FIG. 18, the left end part 9x of the gate wire 9 is located on the right side of the left side surface of the electric field relaxation region 5a. The right end part 9y of the gate wire 9 is located on the right side of the right side surface of the electric field relaxation region 5a.

FIG. 15 schematically indicates the position of the end part of the p-type electric field relaxation region 5a by the dashed and dotted line. FIG. 15 also schematically indicates the position of the end part of the p-type electric field relaxation region 5b by the dashed and dotted line. FIG. 15 further schematically indicates the part of the field insulating film 10 hidden under the gate wire 9 by the dashed and double-dotted line.

Figure 19:
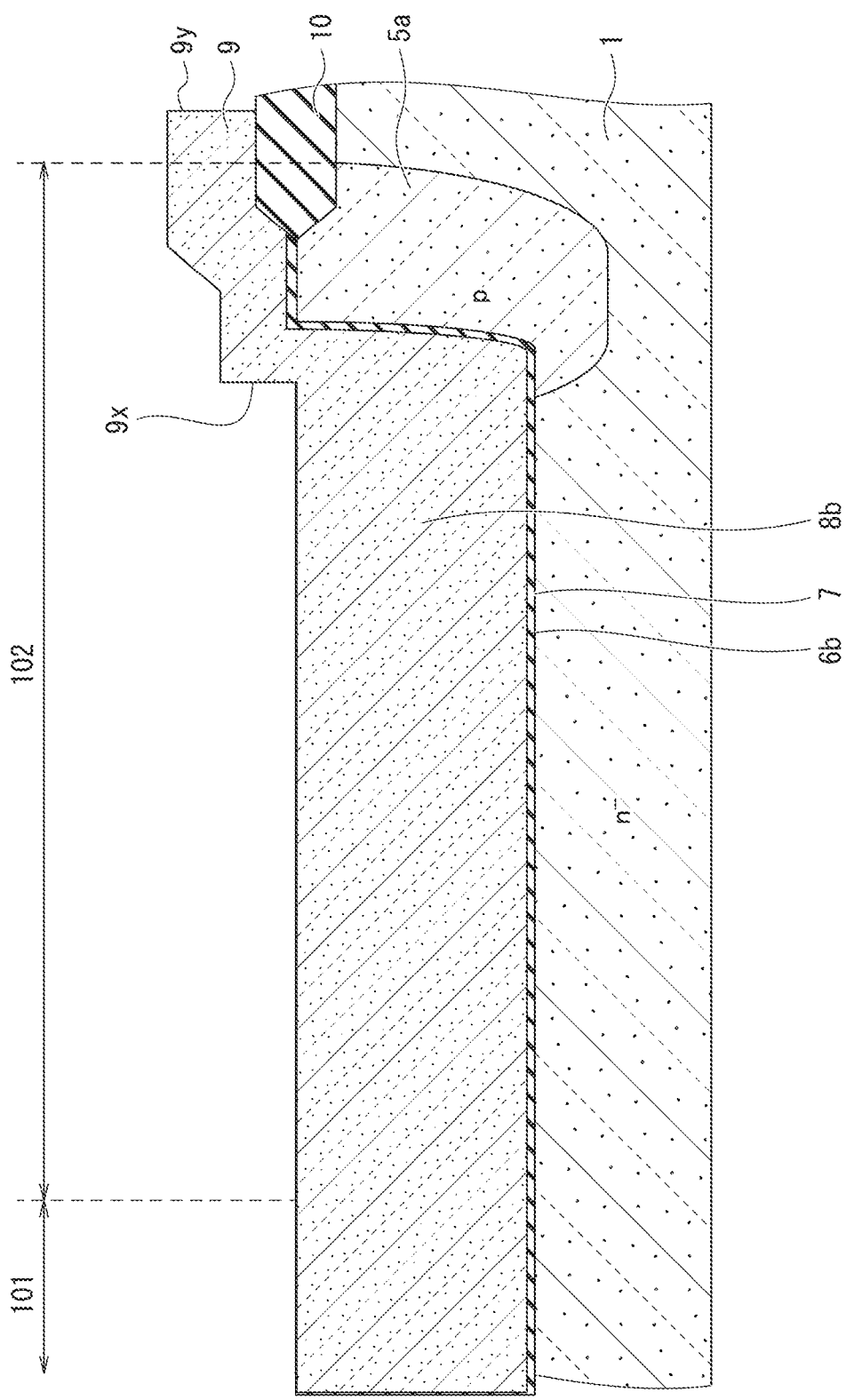
FIG. 19 is a cross-sectional view as viewed from direction D-D in FIG. 15.

FIG. 19 is a cross-sectional view as viewed from direction D-D in the right-left direction in FIG. 15. The trench 6b is provided to extend in the right-left direction from the output-stage element 101 illustrated on the left side in FIG. 19 along the detection element 102 illustrated on the right side in FIG. 19. The gate electrode 8b is buried in the trench 6b via the gate insulating film 7. The top surface of the right end part of the gate electrode 8b is connected to the gate wire 9. The side surface and the bottom surface of the end part of the trench 6b in the longitudinal direction is covered with the p-type electric field relaxation region 5a.

Figure 20:
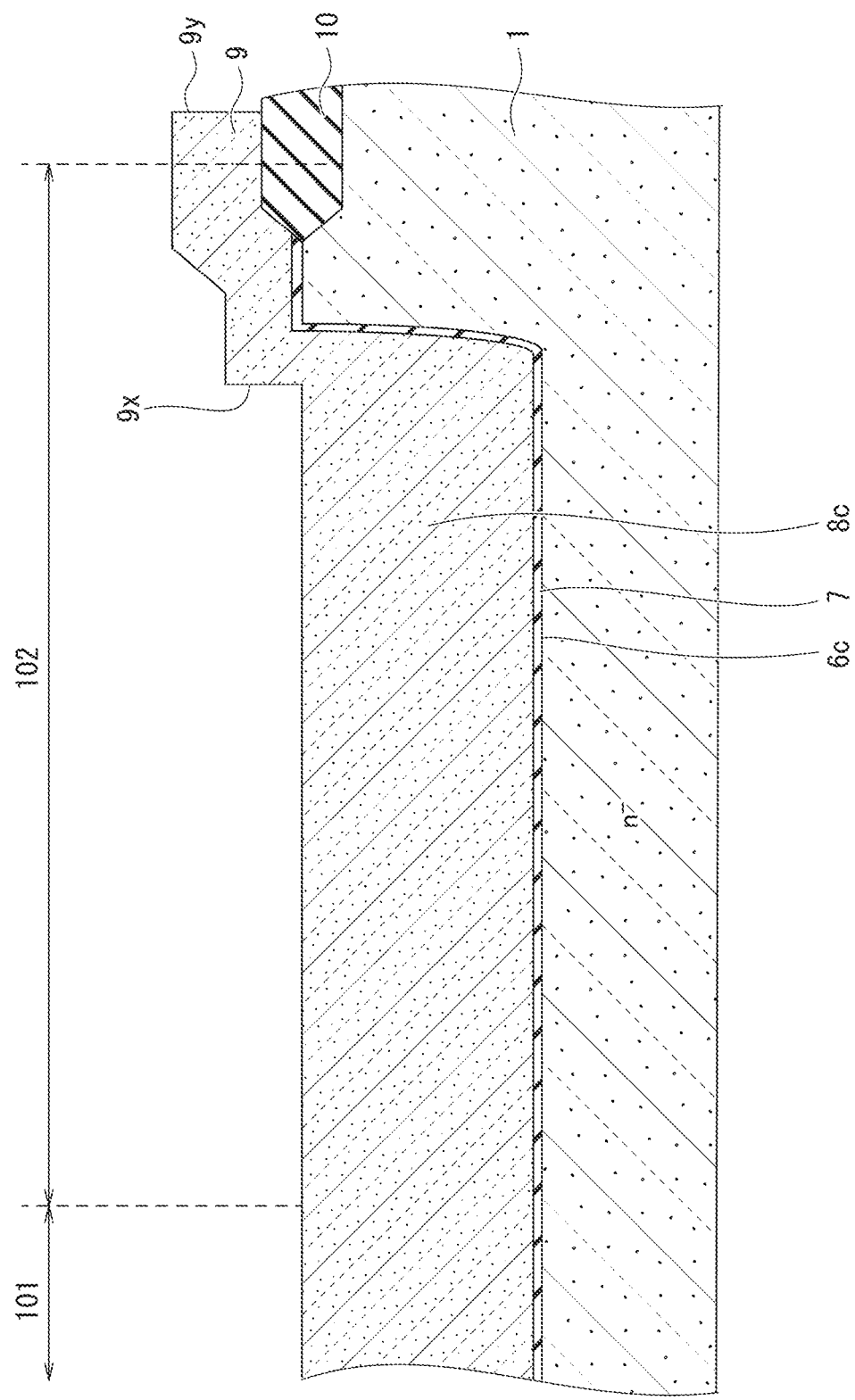
FIG. 20 is a cross-sectional view as viewed from direction E-E in FIG. 15.

FIG. 20 is a cross-sectional view as viewed from direction E-E in the right-left direction in FIG. 15. The trench 6c is provided to extend in the right-left direction from the output-stage element 101 illustrated on the left side in FIG. 20 along the detection element 102 illustrated on the right side in FIG. 20. The gate electrode 8c is buried in the trench 6c via the gate insulating film 7. The top surface of the right end part of the gate electrode 8c is connected to the gate wire 9. The side surface and the bottom surface of the end part of the trench 6c in the longitudinal direction is in contact with the high specific-resistance layer 1.

As illustrated in FIG. 15 to FIG. 20, the semiconductor device according to the second embodiment includes the gate electrode 8x intersecting with the gate electrodes 8a to 8f to separate the channel-formation regions 2a and 2b of the detection element 102 and the channel-formation regions 2d to 2f of the output-stage element 101 from each other. The detection element 102 does not include the respective end parts of the trenches 6a to 6c in the longitudinal direction since the trenches 6a to 6c do not terminate in the longitudinal direction at the position of the gate electrode 8x, so as to exclude the electric field relaxation region 5 as used in the semiconductor device of the first comparative example.

Further, as illustrated in FIG. 18, since the detection electrode 21 of the detection element 102 is not surrounded completely by the main electrode 23 of the output-stage element 101 and the like, the source potential of the detection element 102 can be drawn by use of the detection electrode 21 in the same layer as the main electrode 23, so that the semiconductor device according to the second embodiment does not need to have a multi-layer wiring structure.

First Modified Example

Figure 21:
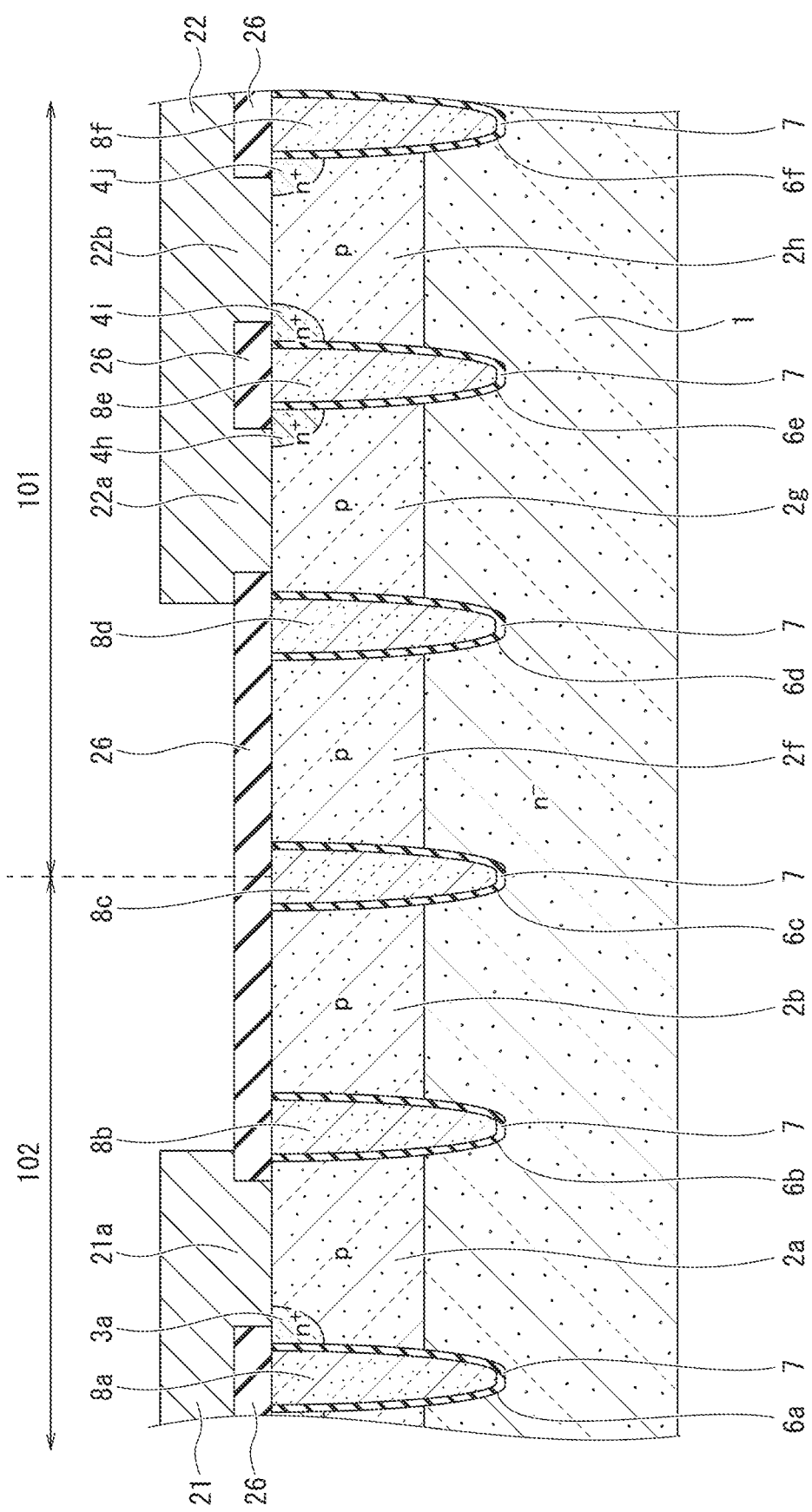
FIG. 21 is a cross-sectional view illustrating a main part of a semiconductor device according to a first modified example of the second embodiment.

A semiconductor device according to a first modified example of the second embodiment is described below with reference to FIG. 21 and FIG. 22. FIG. 21 is a cross-sectional view corresponding to FIG. 16 illustrating the semiconductor device according to the second embodiment, and FIG. 22 is a cross-sectional view corresponding to FIG. 17 illustrating the semiconductor device according to the second embodiment.

As illustrated in FIG. 21, the semiconductor device according to the first modified example differs from the semiconductor device according to the second embodiment in using the trenches 6b to 6d as dummy trenches with a floating potential adjacent to the boundary between the output-stage element 101 and the detection element 102. No main electrode region is formed at the respective side walls of the trenches 6b to 6d. The number of the dummy trenches may be determined as appropriate. For example, only the one trench 6c may be used as a dummy trench, or the two trenches 6b and 6c or the two trenches 6c and 6d may be used as dummy trenches. The four or more of the trenches including the trench 6c may be used as dummy trenches.

Figure 22:
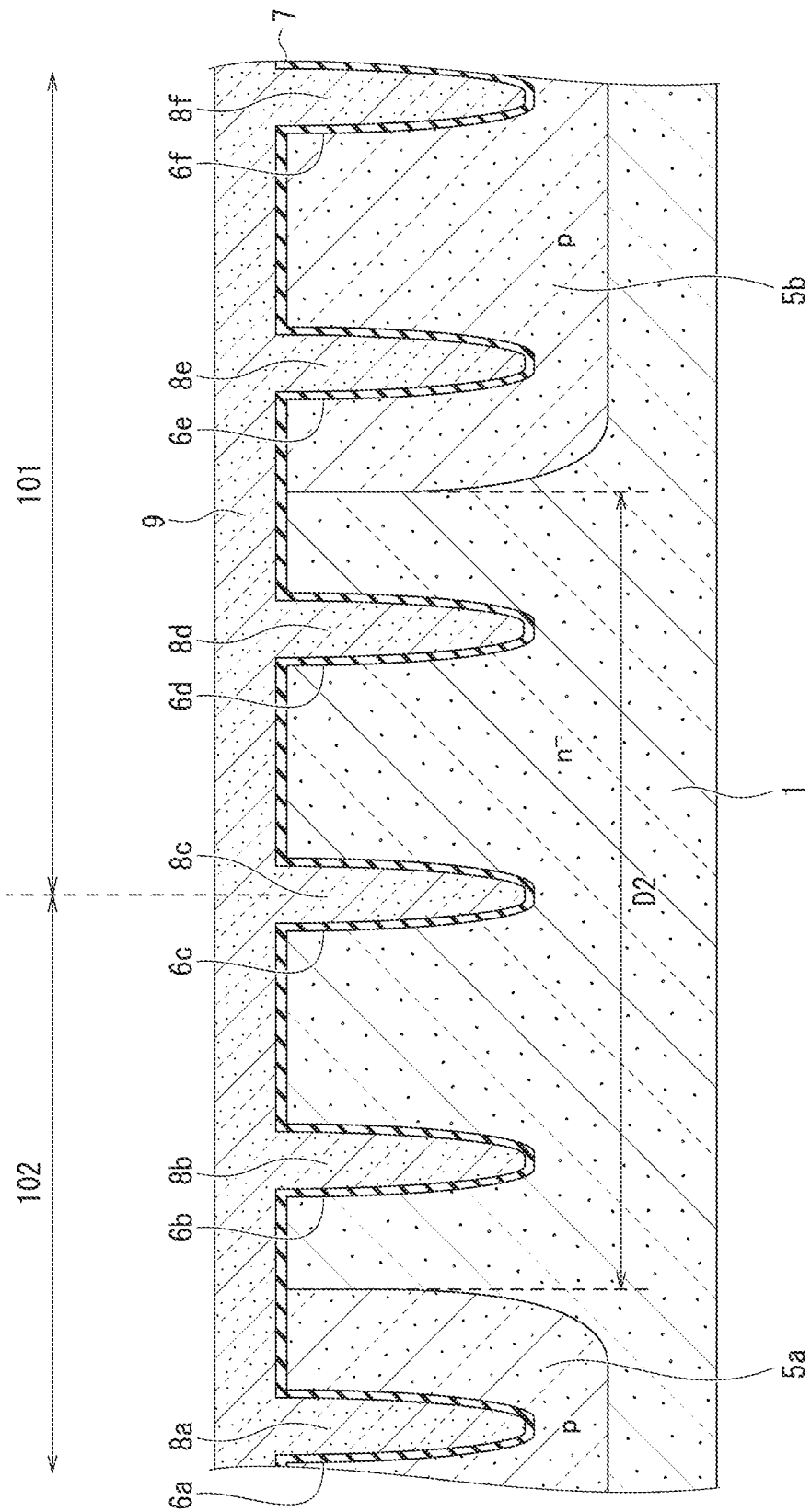
FIG. 22 is a cross-sectional view illustrating another main part of the semiconductor device according to the first modified example of the second embodiment.

FIG. 22 illustrates the region adjacent to the respective end parts of the trenches 6a to 6f in the longitudinal direction. In the detection element 102 illustrated on the left side in FIG. 22, the side surface and the bottom surface adjacent to the end part of the trench 6a in the longitudinal direction are covered with the p-type electric field relaxation region 5a. In the output-stage element 101 illustrated on the right side in FIG. 22, the side surface and the bottom surface adjacent to the respective end parts of the trenches 6e and 6f in the longitudinal direction are covered with the p-type electric field relaxation region 5b. The side surface or the bottom surface adjacent to the respective end parts of the trenches 6b to 6d in the longitudinal direction is not covered with the electric field relaxation region 5a or 5b. A distance D2 between the respective electric field relaxation regions 5a and 5b is set to be wider than the distance D1 illustrated in FIG. 21.

The semiconductor device according to the first modified example of the second embodiment uses the trenches 6b to 6d as the dummy trenches with the floating potential adjacent to the boundary between the output-stage element 101 and the detection element 102, so as to facilitate the expansion of the depletion layers extending from the p-n junctions between the respective electric field relaxation regions 5a and 5b and the high specific-resistance layer 1 upon the application of the high voltage, leading the wide distance D2 between respective electric field relaxation regions 5a and 5b to be depleted.

Second Modified Example

Figure 23:
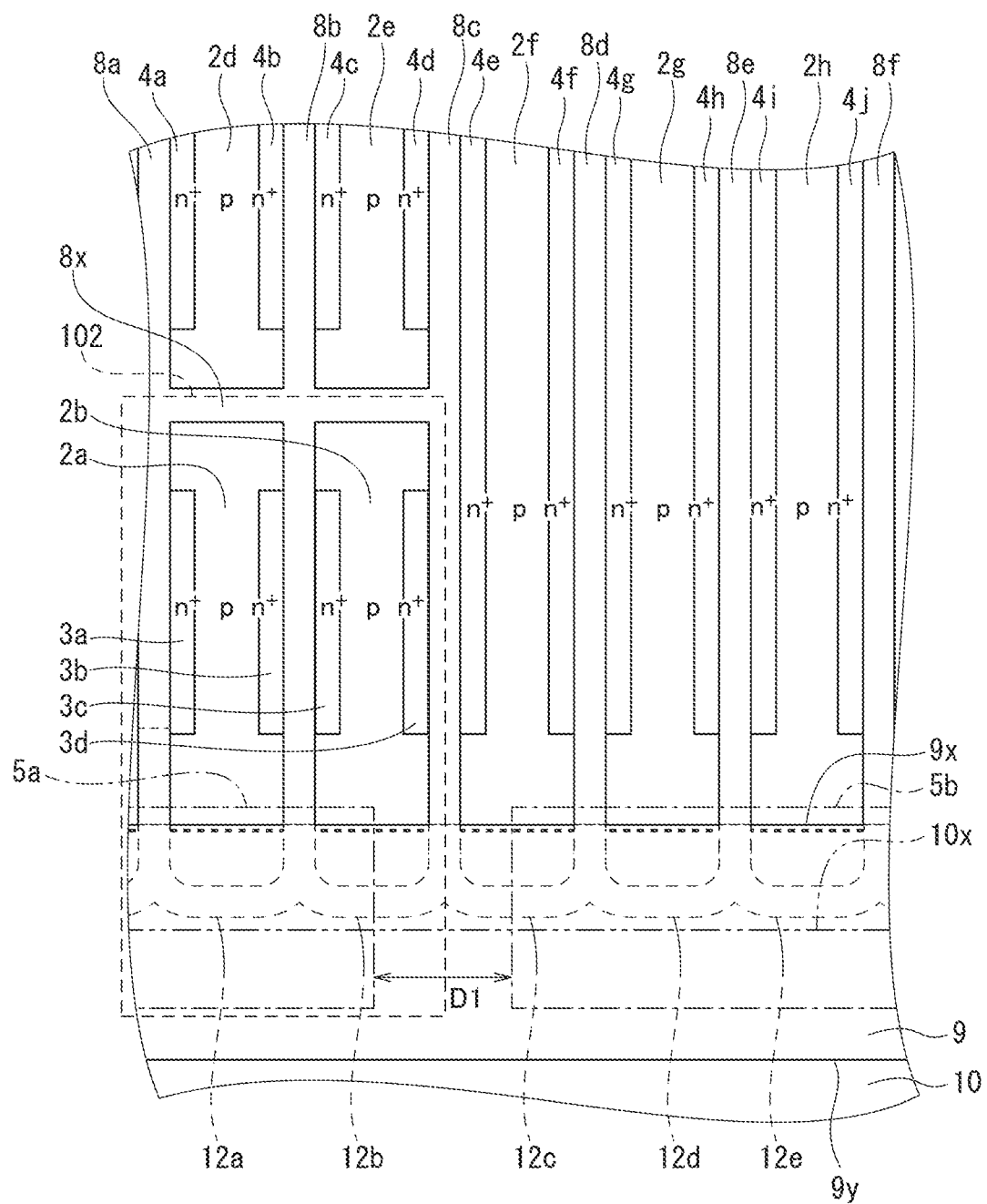
FIG. 23 is a plan view illustrating a semiconductor device according to a second modified example of the second embodiment.

A semiconductor device according to a second modified example of the second embodiment differs from the semiconductor device according to the second embodiment in that the end parts of the trenches in the longitudinal direction in which the gate electrodes 8a to 8f are buried via the gate insulating film (not illustrated) are all connected to each other, as illustrated in FIG. 23.

The end parts of the trenches in the longitudinal direction in which the gate electrodes 8a to 8f are buried via the gate insulating film (not illustrated) are connected to each other via connection parts 12a to 12e. The connection parts 12a to 12e are configured such that the gate electrodes are buried in the trenches via the gate insulating film. The connection part 12a and a part of the connection part 12b are covered with the electric field relaxation region 5a. A part of the connection part 12c and the respective connection parts 12d and 12e are covered with the electric field relaxation region 5b.

The semiconductor device according to the second modified example of the second embodiment, which have the configuration in which the end parts of the trenches in the longitudinal direction in which the gate electrodes 8a to 8f are buried via the gate insulating film (not illustrated) are all connected to each other, can achieve the effects similar to those in the semiconductor device according to the second embodiment.

Third Modified Example

Figure 24:
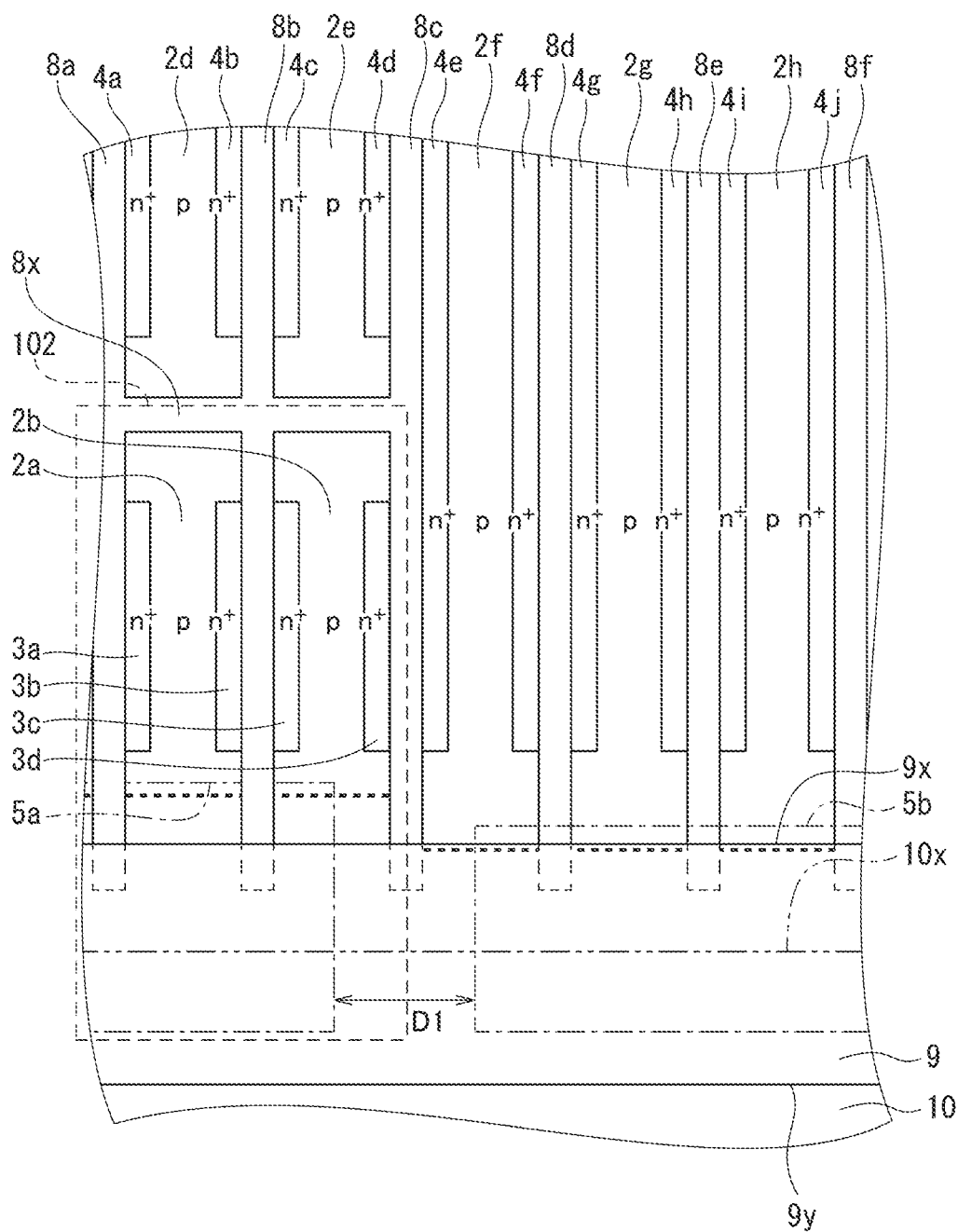
FIG. 24 is a plan view illustrating a semiconductor device according to a third modified example of the second embodiment.

A semiconductor device according to a third modified example of the second embodiment differs from the semiconductor device according to the second embodiment in that the respective end parts of the channel-formation regions 2a and 2b in the longitudinal direction in the detection element 102 are not aligned with (do not conform to) but are displaced from the respective end parts of the channel-formation regions 2f to 2h in the longitudinal direction in the output-stage element, as illustrated in FIG. 24.

The positions at the lower end parts of the respective channel-formation regions 2a, 2b, and 2f to 2h in the planar pattern in FIG. 24 are indicated by the thick dotted lines. The position at the respective lower end parts of the channel-formation regions 2a and 2b in the detection element 102 is located on the upper side of the position at the respective lower end parts of the channel-formation regions 2f to 2h of the output-stage element and the position at the end part 9x of the gate wire 9. The electric field relaxation region 5a is provided to extend closer to the channel-formation regions 2a and 2b than the electric field relaxation region 5b. The lower end parts of the channel-formation regions 2a and 2b in the longitudinal direction are covered with the electric field relaxation region 5a.

The semiconductor device according to the third modified example of the second embodiment, which have the configuration in which the respective end parts of the channel-formation regions 2a and 2b in the longitudinal direction in the detection element 102 are not aligned with (do not conform to) but are displaced from the respective end parts of the channel-formation regions 2f to 2h in the longitudinal direction in the output-stage element, can achieve the effects similar to those in the semiconductor device according to the second embodiment.

Forth Modified Example

Figure 25:
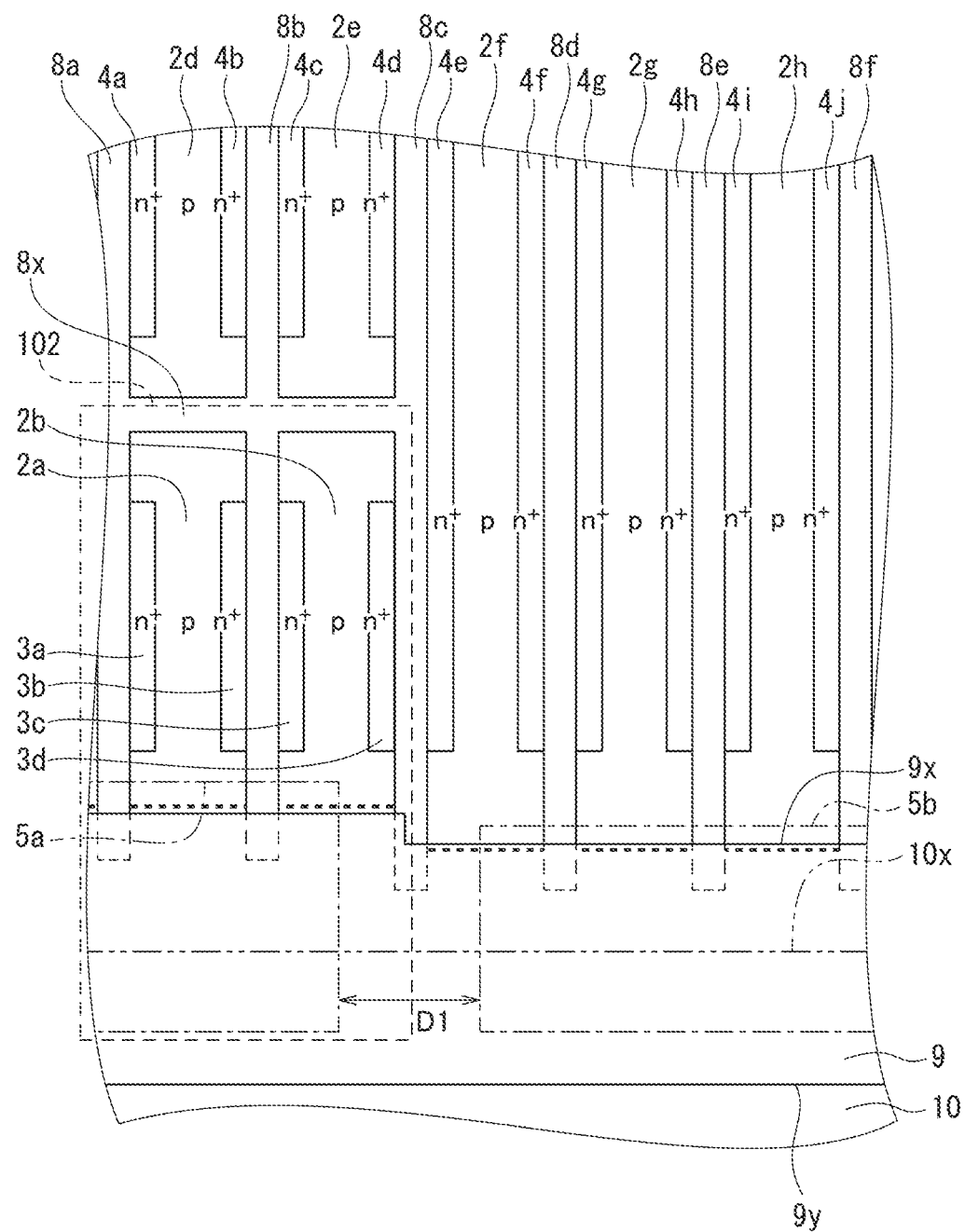
FIG. 25 is a plan view illustrating a semiconductor device according to a fourth modified example of the second embodiment.

A semiconductor device according to a fourth modified example of the second embodiment differs from the semiconductor device according to the second embodiment in that the respective end parts of the trenches in the longitudinal direction in which the gate electrodes 8a and 8b are buried in the detection element 102 are not aligned with (do not conform to) but are displaced from the respective end parts of the trenches in the longitudinal direction in which the gate electrodes 8c to 8f are buried in the output-stage element 101, as illustrated in FIG. 25.

The positions at the lower end parts of the respective channel-formation regions 2a, 2b, and 2f to 2h in the planar pattern in FIG. 25 are indicated by the thick dotted lines. The position at the respective lower end parts of the channel-formation regions 2a and 2b in the detection element 102 is located on the upper side of the position at the respective lower end parts of the channel-formation regions 2f to 2h of the output-stage element 101 and the position at the end part 9x of the gate wire 9. The electric field relaxation region 5a is provided to extend closer to the channel-formation regions 2a and 2b than the electric field relaxation region 5b. The lower end parts of the channel-formation regions 2a and 2b in the longitudinal direction are covered with the electric field relaxation region 5a.

The position of the end parts of the trenches in the longitudinal direction in which the gate electrodes 8a and 8b are buried in the detection element 102 is located on the upper side of the position of the end parts of the trenches in the longitudinal direction in which the gate electrodes 8c to 8f are buried in the output-side element 101. The end part 9x of the gate wire 9 on the detection element 102 side is located on the upper side of the end part 9x of the gate wire 9 on the output-stage element 101 side in FIG. 25 so as to overlap with the respective end parts of the trenches in the longitudinal direction in which the gate electrodes 8a and 8b are buried in the detection element 102.

The semiconductor device according to the fourth modified example of the second embodiment, which have the configuration in which the respective end parts of the trenches in the longitudinal direction in which the gate electrodes 8a and 8b are buried in the detection element 102 are not aligned with (do not conform to) but are displaced from the respective end parts of the trenches in the longitudinal direction in which the gate electrodes 8c to 8f are buried in the output-stage element 101, can achieve the effects similar to those in the semiconductor device according to the second embodiment.

OTHER EMBODIMENTS

As described above, the invention has been described according to the first and second embodiments, but it should not be understood that the description and drawings implementing a portion of this disclosure limit the invention. Various alternative embodiments of the present invention, examples, and operational techniques will be apparent to those skilled in the art from this disclosure.

For example, the first and second embodiments have been illustrated above with the case of using the trench-gate MOS transistor as the output-stage element 101, but are not limited to this case. The output-stage element 101 may be a trench-gate IGBT, for example. When the output-stage element 101 is an IGBT, the $n^+$-type low specific-resistance layer 11 may be used as a $p^+$-type semiconductor layer.

The first and second embodiments have been illustrated above with the case of using Si as a material for the semiconductor base body (1, 11), but may also be applied to a case of using, other than Si, a material of a semiconductor having a greater band gap (a wide band-gap semiconductor) than Si, such as silicon carbide (SiC), gallium nitride (GaN), diamond, and aluminum nitride (AlN).

The configurations disclosed in the first and second embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising an output-stage element and a detection element that detects a current of the output-stage element,
    each of the output-stage element and the detection element comprising:
        a drift region of a first conductivity-type;
        a channel-formation region of a second conductivity-type deposited at an upper part of the drift region;
        a main electrode region of the first conductivity-type deposited at an upper part of the channel-formation region; and
        a gate electrode buried via a gate insulating film in one or more first trenches in contact with the main electrode region, the channel-formation region, and the drift region,
    wherein the first trenches used in common with the detection element and the output-stage element extend in parallel to each other in a planar pattern, and
    a plurality of second trenches extending in parallel to each other in a direction perpendicular to an extending direction of the first trenches intersect with at least the two first trenches among the first trenches and interpose the detection element in the planar pattern so as to separate the channel-formation region of the output-stage element and the channel-formation region of the detection element from each other.

2. The semiconductor device of claim 1, further comprising a control circuit configured to control the output-stage element in accordance with a detection result of the detection element.

3. The semiconductor device of claim 2, further comprising:
    a detection electrode connected to the main electrode region of the detection element; and a main electrode provided in a same layer as the detection electrode and connected to the main electrode region of the output-stage element, wherein the detection electrode is drawn toward the control circuit via a wire that is an upper layer located above the main electrode.

4. The semiconductor device of claim 1, wherein:
the output-stage element includes end parts of the first trenches in a longitudinal direction; and
the semiconductor device further comprises an electric field relaxation region of the second conductivity-type provided to cover a side surface and a bottom surface of the respective first trenches.

5. The semiconductor device of claim 1, wherein end parts of the first trenches are all connected to each other.

6. A semiconductor device comprising an output-stage element and a detection element that detects a current of the output-stage element,
each of the output-stage element and the detection element comprising:
a drift region of a first conductivity-type;
a channel-formation region of a second conductivity-type deposited at an upper part of the drift region;
a main electrode region of the first conductivity-type deposited at an upper part of the channel-formation region; and
a gate electrode buried via a gate insulating film in one or more first trenches in contact with the main electrode region, the channel-formation region, and the drift region,
wherein the first trenches used in common with the detection element and the output-stage element extend in parallel to each other in a planar pattern,
at least one second trench extending in a direction perpendicular to an extending direction of the first trenches intersects with at least the two first trenches among the first trenches so as to separate the channel-formation region of the output-stage element and the channel-formation region of the detection element from each other in the planar pattern,
the output-stage element is located only on one side of the detection element in a longitudinal direction of the first trenches.

7. The semiconductor device of claim 6, further comprising a control circuit configured to control the output-stage element in accordance with a detection result of the detection element.

8. The semiconductor device of claim 7, further comprising:
a detection electrode connected to the main electrode region of the detection element; and
a main electrode provided in a same layer as the detection electrode and connected to the main electrode region of the output-stage element,
wherein the detection electrode is drawn toward the control circuit via a wire in the same layer as the main electrode.

9. The semiconductor device of claim 6, wherein:
the output-stage element includes some of end parts of the first trenches in the longitudinal direction;
the detection element includes other end parts of the first trenches in the longitudinal direction; and
the semiconductor device further comprises
a first electric field relaxation region of the second conductivity-type provided to cover the end parts of the first trenches in the output-stage element, and a second electric field relaxation region of the second conductivity-type provided separately from the first electric field relaxation region to cover the end parts of the first trenches in the detection element.

10. The semiconductor device of claim 9, wherein an end part of the first trench in the longitudinal direction located at a boundary between the output-stage element and the detection element among the first trenches is located between the first and second electric field relaxation regions.

11. The semiconductor device of claim 9, wherein a distance between the first and second electric field relaxation regions is defined such that a depletion layer extending from a junction between the drift region in the output-stage element and the first electric field relaxation region is connected to a depletion layer extending from a junction between the drift region in the detection element and the second electric field relaxation region when a higher voltage than in a normal operation is applied.

12. The semiconductor device of claim 6, wherein end parts of the first trenches are all connected to each other.

13. A semiconductor device comprising an output-stage element and a detection element that detects a current of the output-stage element,
each of the output-stage element and the detection element comprising:
a drift region of a first conductivity-type;
a channel-formation region of a second conductivity-type deposited at an upper part of the drift region;
a main electrode region of the first conductivity-type deposited at an upper part of the channel-formation region; and
a gate electrode buried via a gate insulating film in one or more first trenches in contact with the main electrode region, the channel-formation region, and the drift region,
wherein the first trenches used in common with the detection element and the output-stage element extend in parallel to each other in a planar pattern,
at least one second trench extending in a direction perpendicular to an extending direction of the first trenches intersects with at least the two first trenches among the first trenches so as to separate the channel-formation region of the output-stage element and the channel-formation region of the detection element from each other in the planar pattern,
the channel-formation region of the detection element is arranged such that an end part on a side opposite to a side separated from the channel-formation region of the output-stage element by the second trench is in contact with a first electric field relaxation region of the second conductivity-type having a depth greater than the first trenches, and
the channel-formation region of the output-stage element is in contact with a second electric field relaxation region of the second conductivity-type in a longitudinal direction of the first trenches, the second electric field relaxation region being separated from the first electric field relaxation region and having a depth greater than the first trenches.

14. The semiconductor device of claim 13, further comprising a control circuit configured to control the output-stage element in accordance with a detection result of the detection element.

15. The semiconductor device of claim 14, further comprising:
a detection electrode connected to the main electrode region of the detection element; and a main electrode provided in a same layer as the detection electrode and connected to the main electrode region of the output-stage element, wherein the detection electrode is drawn toward the control circuit via a wire in the same layer as the main electrode.

16. The semiconductor device of claim 13, wherein:

the output-stage element includes some of end parts of the first trenches in the longitudinal direction;

the detection element includes other end parts of the first trenches in the longitudinal direction;

the first electric field relaxation region covers the end parts of the first trenches in the output-stage element; and the second electric field relaxation region covers the end parts of the first trenches in the detection element.

17. The semiconductor device of claim 16, wherein an end part of the first trench in the longitudinal direction located at a boundary between the output-stage element and the detection element among the first trenches is located between the first and second electric field relaxation regions.

18. The semiconductor device of claim 13, wherein a distance between the first and second electric field relaxation regions is defined such that a depletion layer extending from a junction between the drift region in the output-stage element and the first electric field relaxation region is connected to a depletion layer extending from a junction between the drift region in the detection element and the second electric field relaxation region when a higher voltage than in a normal operation is applied.

19. The semiconductor device of claim 13, wherein end parts of the first trenches are all connected to each other.

\* \* \* \* \*